US012685069B2

(12) United States Patent
Wu et al.

(10) Patent No.: US 12,685,069 B2
(45) Date of Patent: Jul. 14, 2026

(54) MANUFACTURING METHOD OF THE SEMICONDUCTOR PACKAGE, PICK AND PLACE DEVICE, AND WORKPIECE HANDLING APPARATUS

(71) Applicant: Taiwan Semiconductor Manufacturing Company, Ltd., Hsinchu (TW)

(72) Inventors: Chien-Wei Wu, New Taipei City (TW); Hsien-Ju Tsou, Taipei (TW); Yung-Chi Lin, New Taipei City (TW); Tsang-Jiuh Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 622 days.

(21) Appl. No.: 18/165,896

(22) Filed: Feb. 7, 2023

(65) Prior Publication Data

US 2024/0178015 A1 May 30, 2024

Related U.S. Application Data

(60) Provisional application No. 63/428,119, filed on Nov. 28, 2022.

(51) Int. Cl.
| | |
|---|---|
| *H10P 72/00* | (2026.01) |
| *H10P 72/78* | (2026.01) |
| *H10W 74/01* | (2026.01) |
| *H10B 80/00* | (2023.01) |
| *H10W 70/09* | (2026.01) |
| *H10W 90/00* | (2026.01) |

(52) U.S. Cl.
CPC .......... *H10P 72/0442* (2026.01); *H10P 72/78* (2026.01); *H10W 74/019* (2026.01); *H10B 80/00* (2023.02); *H10W 70/09* (2026.01); *H10W 90/00* (2026.01)

(58) Field of Classification Search
None
See application file for complete search history.

(56) References Cited

U.S. PATENT DOCUMENTS

| | | | | |
|---|---|---|---|---|
| 2011/0217814 A1* | 9/2011 | Gao | ..................... | H01L 24/19 |
| | | | | 257/E21.599 |
| 2021/0060798 A1* | 3/2021 | Jeong | ............... | H01L 21/67144 |
| 2023/0356520 A1* | 11/2023 | Ramaswamy | ........ | B32B 43/006 |

* cited by examiner

*Primary Examiner* — Jay C Chang
(74) *Attorney, Agent, or Firm* — JCIPRNET

(57) ABSTRACT

A manufacturing method of a semiconductor package includes the following steps. A semiconductor device is picked up from a carrier by a pick and place device, wherein the pick and place device includes a flexible head having a bonding portion configured to be in contact with the semiconductor device, a neck portion connecting the bonding portion, wherein a minimum width of the neck portion is substantially smaller than a maximum width of the bonding portion. The semiconductor device is placed and pressed onto a substrate by the pick and place device. An encapsulating material is formed over the substrate to laterally encapsulating the semiconductor device. A redistribution structure is formed over the semiconductor device and the encapsulating material. The substrate is removed.

20 Claims, 24 Drawing Sheets

MANUFACTURING METHOD OF THE SEMICONDUCTOR PACKAGE, PICK AND PLACE DEVICE, AND WORKPIECE HANDLING APPARATUS

CROSS-REFERENCE TO RELATED APPLICATION

This application claims the priority benefit of U.S. provisional application Ser. No. 63/428,119, filed on Nov. 28, 2022. The entirety of the above-mentioned patent application is hereby incorporated by reference herein and made a part of this specification.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (POP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
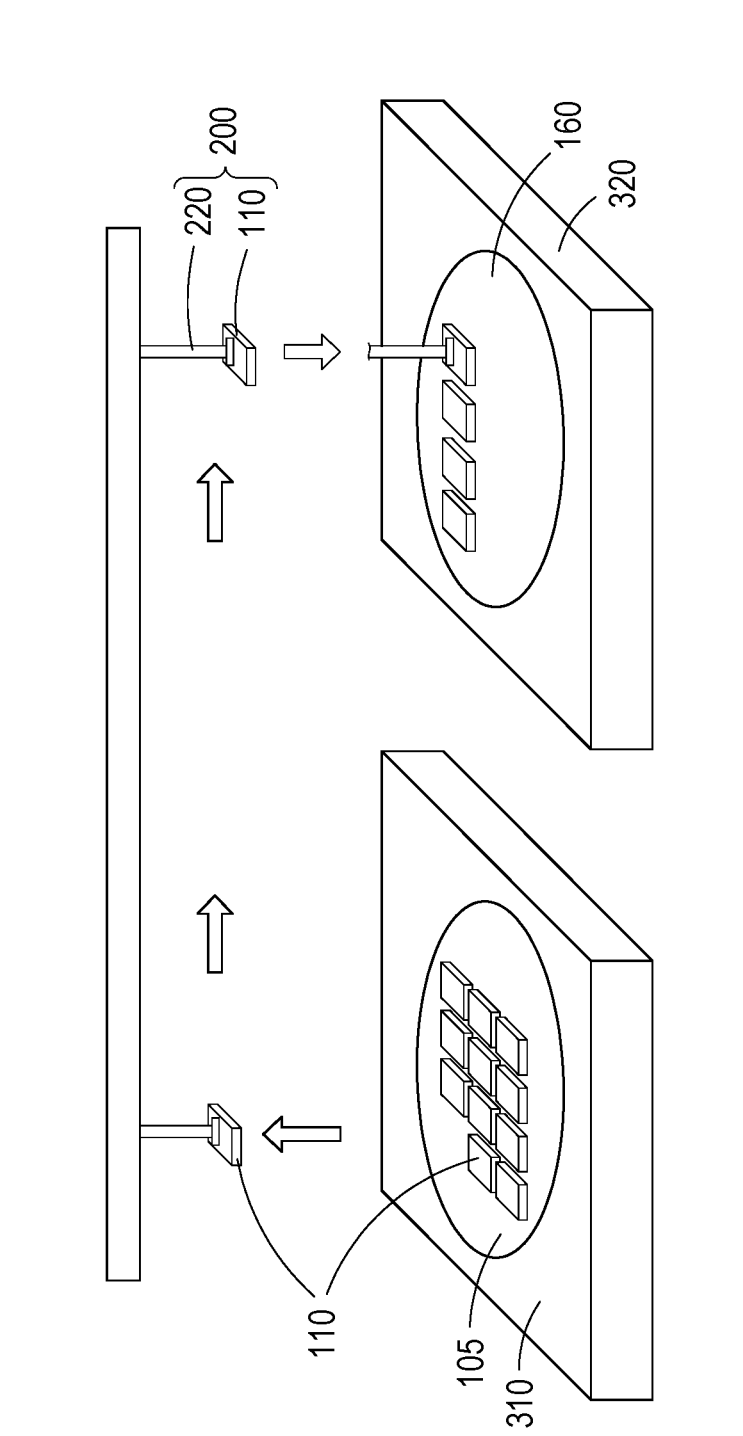
FIG. 1 illustrates a schematic view of a workpiece handling apparatus according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A workpiece handling apparatus, a pick and place device and the manufacturing method of using the workpiece handling apparatus to form a semiconductor package are provided in accordance with various exemplary embodiments. The intermediate stages of forming a semiconductor package based on dies bonded onto a substrate (e.g., a die attach film (DAFs) on a carrier, or the like) are illustrated. The variations of the embodiments are discussed. Throughout the various views and illustrative embodiments, like reference numbers are used to designate like elements.

Figure 2:
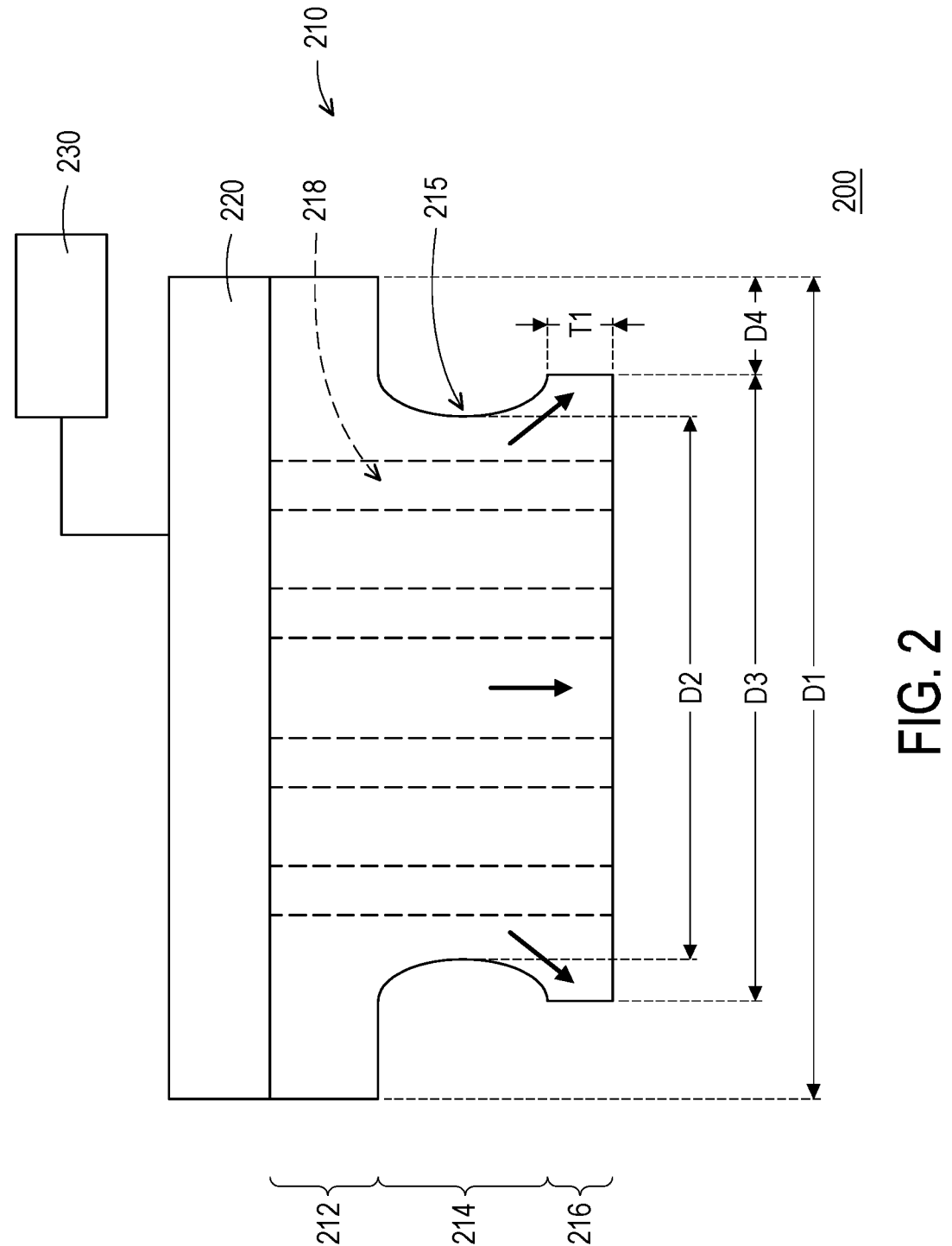
FIG. 2 illustrates a side view of a pick and place device according to some exemplary embodiments of the present disclosure.

FIG. 1 illustrates a schematic view of a workpiece handling apparatus according to some exemplary embodiments of the present disclosure. FIG. 2 illustrates a side view of a pick and place device according to some exemplary embodiments of the present disclosure. In some embodiments, the workpiece handling apparatus 400 includes at least one chuck table (two chuck tables 310, 320 are illustrated herein) and a pick and place device 200 disposed over the chuck tables 310, 320. In one embodiment, the chuck tables 310 is configured for carrying a plurality of workpiece 110, while the pick and place device 200 is configured to move relatively to the chuck tables 310, 320 for picking up one of the workpieces 110 from the chuck tables 310 and placing the workpiece 110 onto the chuck table 320. In one embodiments, the workpiece 110 may be a plurality of sawed semiconductor devices (dies), which are attached to a carrier (e.g., a tape carrier) 105 used to adhere to the discrete semiconductor devices 110 in a wafer. In accordance with some embodiments of the present disclosure, the semiconductor devices 110 include integrated circuit devices such as transistors, diodes, resistors, capacitors (not shown), and/or the like. One of the examples of the semiconductor devices 110 will be described in more detail later on. In such embodiment, the pick and place device 200 is configured to remove individual semiconductor devices (e.g., semiconductor dies) 110 from a carrier 105, such as a dicing tape, or the like, over the chuck table 310, and then place and press the individual semiconductor devices 110 onto a substrate 160 over the chuck table 320. Accordingly, the individual semiconductor devices 110 are typically diced or singulated from each other before the pick and place device 200 performs a pick and place operation.

The semiconductor device 110 may including a semiconductor substrate such as a silicon substrate, a III-V compound semiconductor substrate, a germanium substrate, a silicon germanium substrate, or the like. It is appreciated that although the semiconductor devices 110 are illustrated as separated far away from each other for clarity, in some embodiments, however, the semiconductor devices 110 are actually closely located from each other. A dicing or singulation process may be performed on a semiconductor wafer including semiconductor dies, so as to separate the semiconductor dies from each other.

Referring to FIG. 2, in some embodiments, the pick and place device 200 includes a holder 220 coupled to a vacuum pump 230, and a flexible head 210 connected to the holder 220. In some embodiments, the flexible head 210 includes a base portion 212, a neck portion 214 and a bonding portion 216, and a plurality of channels 218 extending through the flexible head 210 and in fluid communication with the vacuum pump 230. In some embodiments, the base portion 212 is connected to the holder 220, the bonding portion 216 is configured to be in contact with the workpiece 110, a neck portion 214 is connected between the base portion 212 and the bonding portion 216. The channels 218 extend through the base portion 212, the neck portion 214 and the bonding portion 216 of the flexible head 210 and is in fluid communication with the vacuum pump 230 for applying a vacuum environment between the workpiece 110 and the flexible head 210 for picking up the workpiece 110 by suction force.

In general, after the workpiece 110 is placed on the substrate 160, a force is exerted on the workpiece 110 for pressing and bonding the workpiece 110 to the substrate 160. Accordingly, in order to provide buffer and avoiding damage the semiconductor device 110, a material of the flexible head 210 may include rubber, silicone, or any other suitable material with elasticity and flexibility. For example, a Young's modulus of the flexible head 210 may be substantially equal to or greater than about 100 N/m². However, the deformation of the flexible head 210 due to the force applied by the pick and place device 200 may result in undesirable stress concentration, which may affect the bonding quality.

Accordingly, in some embodiments, the width of the neck portion 214 is substantially smaller than the width of the bonding portion 216, such that the force applied from the top of the pick and place device can be firstly concentrated in the center region (due to the neck portion 214 with smaller width) of the bonding surface of the flexible head 210 and then spread out toward the peripheral region (due to the bonding portion 214 with wider width) of the bonding surface of the flexible head 210. Accordingly, the stress concentration may be mitigated by reducing the width W2 of the neck portion 214. That is, with the configuration of the width D2 of the neck portion 214 further away from the semiconductor device 110 being smaller than the width W3 of the bonding portion 216 contacting the semiconductor device 110, the undesirable stress concentration can be reduced and bonding quality of the semiconductor device 110 and the substrate 160 can be improved.

In one embodiment, a minimum width D2 of the neck portion 214 is substantially smaller than a maximum width D3 of the bonding portion 216. In some embodiments, the minimum width D2 of the neck portion 214 is also substantially smaller than a maximum width D1 of the base portion 212 for connecting the holder 220. The maximum width D1 of the base portion 212 is about the same as the width of the holder 220 for connection. In the present embodiment, the maximum width D1 of the base portion 212 may be substantially greater than the maximum width D3 of the bonding portion 212, but, in other embodiment, the maximum width D1 of the base portion 212 may be substantially equal to or smaller than the maximum width D3 of the bonding portion 212. The disclosure is not limited thereto as long as the minimum width D2 of the neck portion is the thinnest part among the flexible head 210.

In some embodiments, a difference D4 between the maximum width D3 of the bonding portion 216 and the minimum width D2 of the neck portion 214 substantially ranges from about 0.4 mm to about 0.8 mm. If the difference D4 is greater than 0.8 mm, the channel 218 extending through the neck portion 214 may be exposed. If the difference D4 is smaller than 0.4 mm, issue of stress concentration may still occur at the bonding surface of the flexible head 210. In one embodiment, a thickness T1 of the bonding portion 216 substantially ranges from about 0.1 mm to about 0.4 mm. If the thickness T1 is greater than 0.4 mm, issue of stress concentration may still occur at the bonding surface of the flexible head 210. If the thickness T1 is smaller than 0.1 mm, the mechanical strength of the bonding portion may not be enough, which may lead to huge deformation and affect or even damage the channels 218 embedded in the flexible head 210. In the present embodiment, the neck portion 214 has a curvy profile, and a width of the neck portion 214 is gradually increases from a center of the neck portion 214 to two opposite ends of the neck portion 214 as it is shown in FIG. 2.

Figure 3:
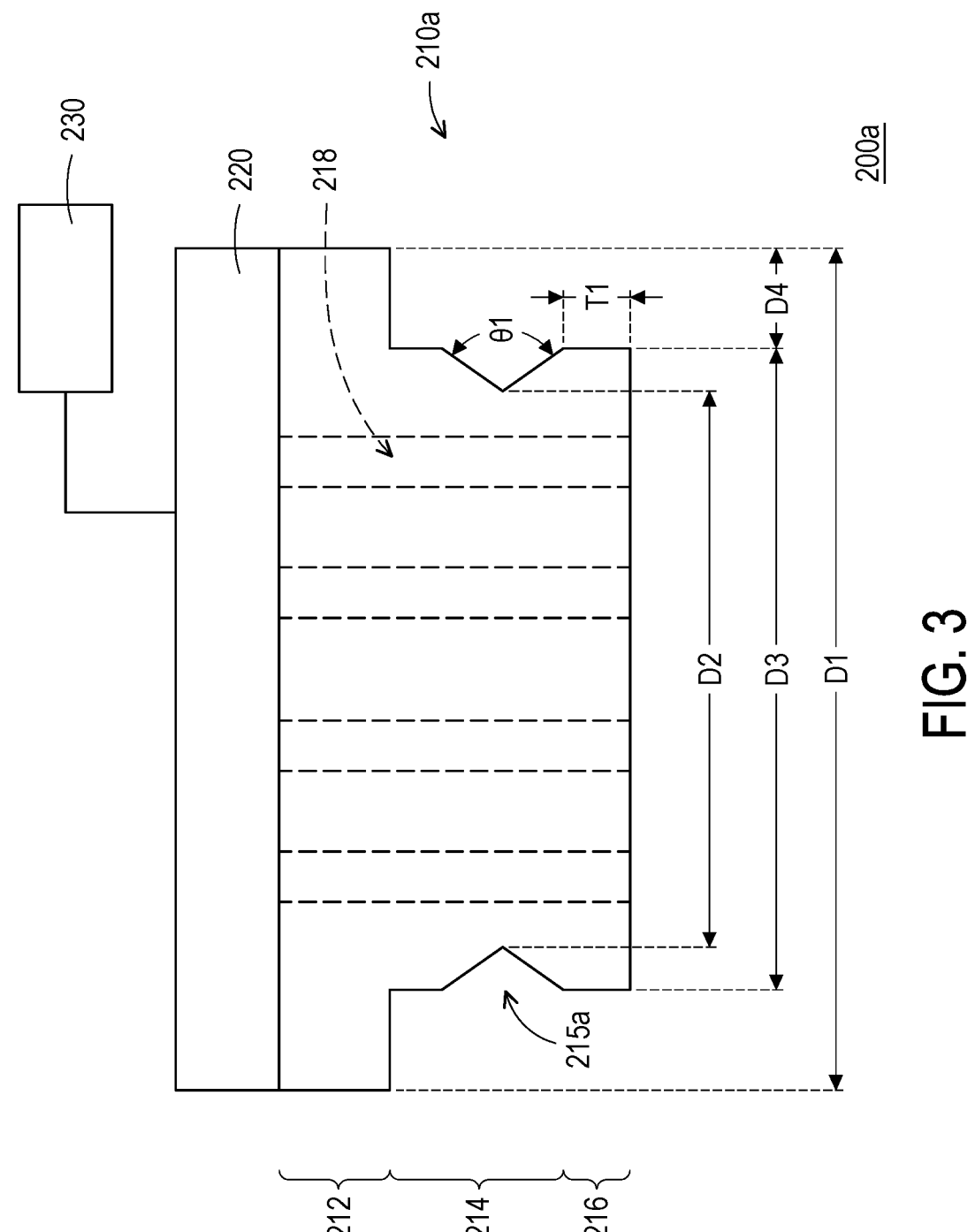
FIG. 3 illustrates a side view of a pick and place device according to other exemplary embodiments of the present disclosure.

FIG. 3 illustrates a side view of a pick and place device according to other exemplary embodiments of the present disclosure. In some embodiments of the pick and place device 200*a*, the neck portion 214 of the flexible head 210*a* includes a groove 215 surrounding a perimeter of the neck portion 214. In one embodiment, the groove 215 has a valley where an angle θ1 included between adjacent sidewalls of the groove 215 ranges from 85° to 95°. In one embodiment, the angle θ1 is about 90°. In such embodiment, the adjacent sidewalls of the groove 215 respectively extending to the base portion 212 and the bonding portion 216 are slanted surfaces. With such configuration, the minimum width D2 of the neck portion 214 is substantially smaller than the maximum width D3 of the bonding portion 216 and the maximum width D1 of the base portion 212. The difference D4 between the maximum width D3 of the bonding portion 216 and the minimum width D2 of the neck portion 214 substantially ranges from about 0.4 mm to about 0.8 mm. The thickness T1 of the bonding portion 216 substantially ranges from about 0.1 mm to about 0.4 mm.

Figure 4:
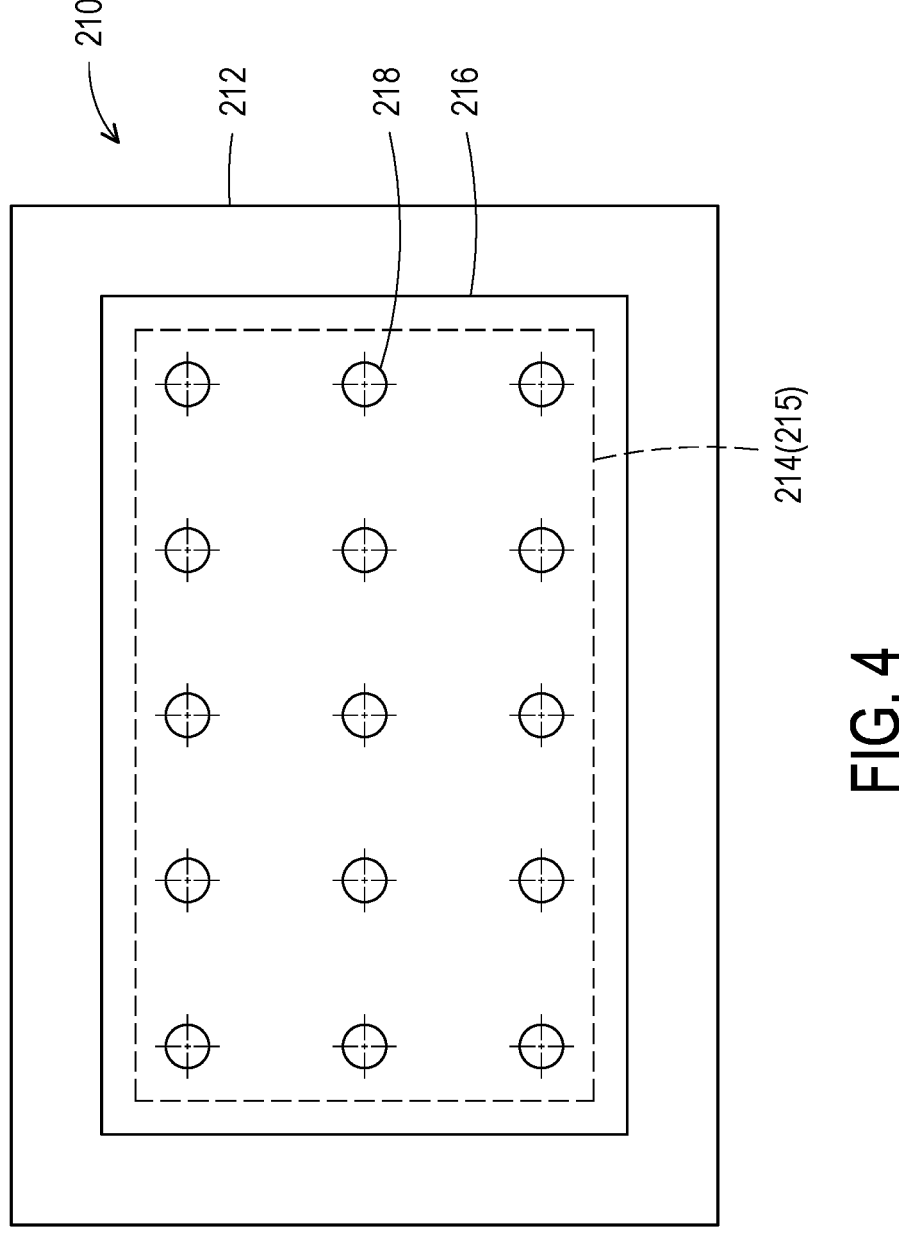
FIG. 4 illustrates a top view of a flexible head of a pick and place device according to other exemplary embodiments of the present disclosure.
Figure 5:
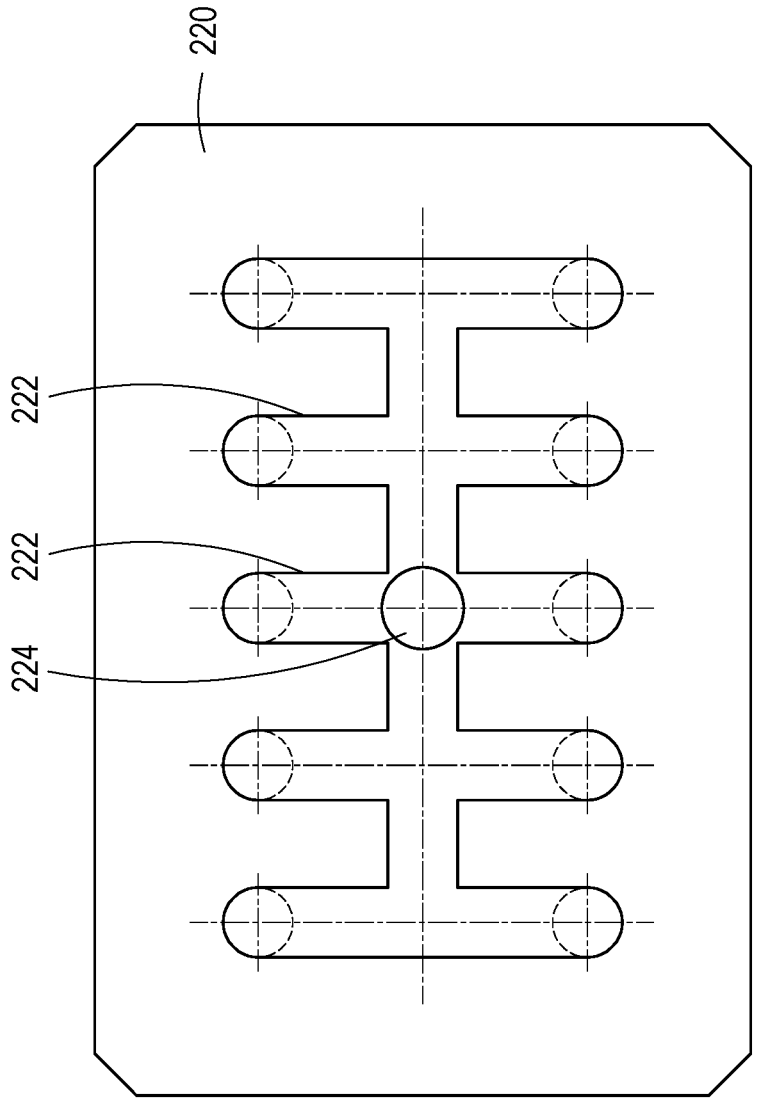
FIG. 5 illustrates a top view of a holder of a pick and place device according to other exemplary embodiments of the present disclosure.

FIG. 4 illustrates a top view of a flexible head of a pick and place device according to other exemplary embodiments of the present disclosure. FIG. 5 illustrates a top view of a holder of a pick and place device according to other exemplary embodiments of the present disclosure. Referring to FIG. 4 and FIG. 5, in some embodiments, the flexible head 210 of the pick and place device 200 includes a plurality of channels 218 arranged in an array manner and coupled to the vacuum pump 230 (illustrated in FIG. 2) via a plurality of vacuum flow paths 222, 224 of the holder 220. The channels 218 can be individual passages, or can have other configurations. The vacuum flow paths 222, 224 are in fluid communication with the channels 218 and the vacuum pump 230. Accordingly, when the vacuum pump 230 is activated, the semiconductor device 110 (illustrated in FIG. 1) can be releasably secured in contact with the flexible head 210 of the pick and place device 200 via the channels 218.

FIG. 6 to FIG. 19 illustrate cross sectional views of intermediate stages in the manufacturing of a semiconductor package according to some exemplary embodiments of the present disclosure. FIG. 6 to FIG. 19 illustrate one of the possible manufacturing processes of a semiconductor package using the workpiece handling apparatus 400 including the pick and place device 200. The workpiece handling apparatus 400 and the pick and place device 200 described above may be applied to other semiconductor processes that involve picking up a workpiece 110 and placing and bonding a workpiece 110 over a carrier/substrate. The workpiece 110 may be a semiconductor die, a semiconductor wafer, an interposer, or any other suitable semiconductor devices. The disclosure is not limited thereto.

Figure 6:
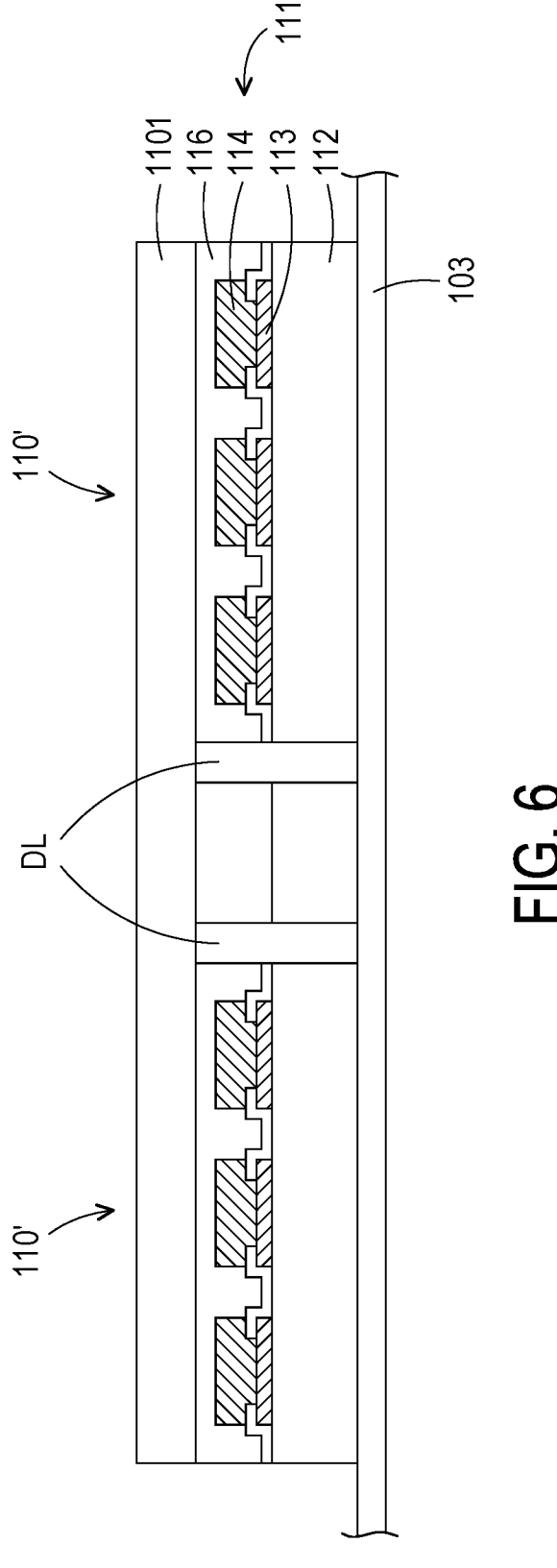
FIG. 6 to FIG. 19 illustrate cross sectional views of intermediate stages in the manufacturing of a semiconductor package according to some exemplary embodiments of the present disclosure.

In accordance with some embodiments of the disclosure, referring to FIG. 6, a semiconductor wafer 111 has a plurality of regions 110' that include integrated circuits. The regions 110' are separated by dicing lines. The dicing lines are areas of semiconductor wafer 111 that do not contain integrated circuits and are designed as locations along which the wafer will be diced. In some exemplary embodiments, each of the regions 110' may include a plurality of electrical contacts 114 (such as copper vias) formed on an active surface (e.g. the top surface) of the semiconductor wafer 111 and electrically coupled to the pads 113 on the substrate 112 of the semiconductor wafer 111. In some embodiments, a dielectric layer 116 may be formed on the active surface (e.g. the top surface) of the semiconductor wafer 111, and may cover the top surfaces of the electrical contacts 114. In other embodiments, the top surface of the dielectric layer 116 may be substantially level with the top surfaces of the electrical contacts 114. Alternatively, the dielectric layer 116 may be omitted, and the electrical contacts 114 protrude from the active surface of the semiconductor wafer 111.

In one embodiment, a protection layer 1101 may be provided over the semiconductor wafer 111 for protecting the active surface of the semiconductor wafer 111 during the transfer process. The protection layer 1101 may be composed of a layer covering and protecting integrated circuits formed on the surface of semiconductor wafer 111. The protection layer 1101 may also cover dicing lines DL formed between each of the regions 110'. In some embodiments, forming the protection layer 1101 includes forming a layer such as, but not limited to, a photo-resist layer or a patterning layer. For example, a polymer layer such as a photo-resist layer may be composed of a material otherwise suitable for use in a lithographic process. However, in other embodiments, non-photo-sensitive and/or less costly materials are used as the protection layer 1101. In an embodiment, the protection layer 1101 is formed by uniformly spinning on a mask above a semiconductor wafer 111. In some embodiments, the semiconductor wafer 111 is provided over a carrier 103 such as a dicing tape. The dicing tape may be a portion of a framed dicing tape, e.g., framed by a metal or plastic, or other material, ring.

Figure 7:
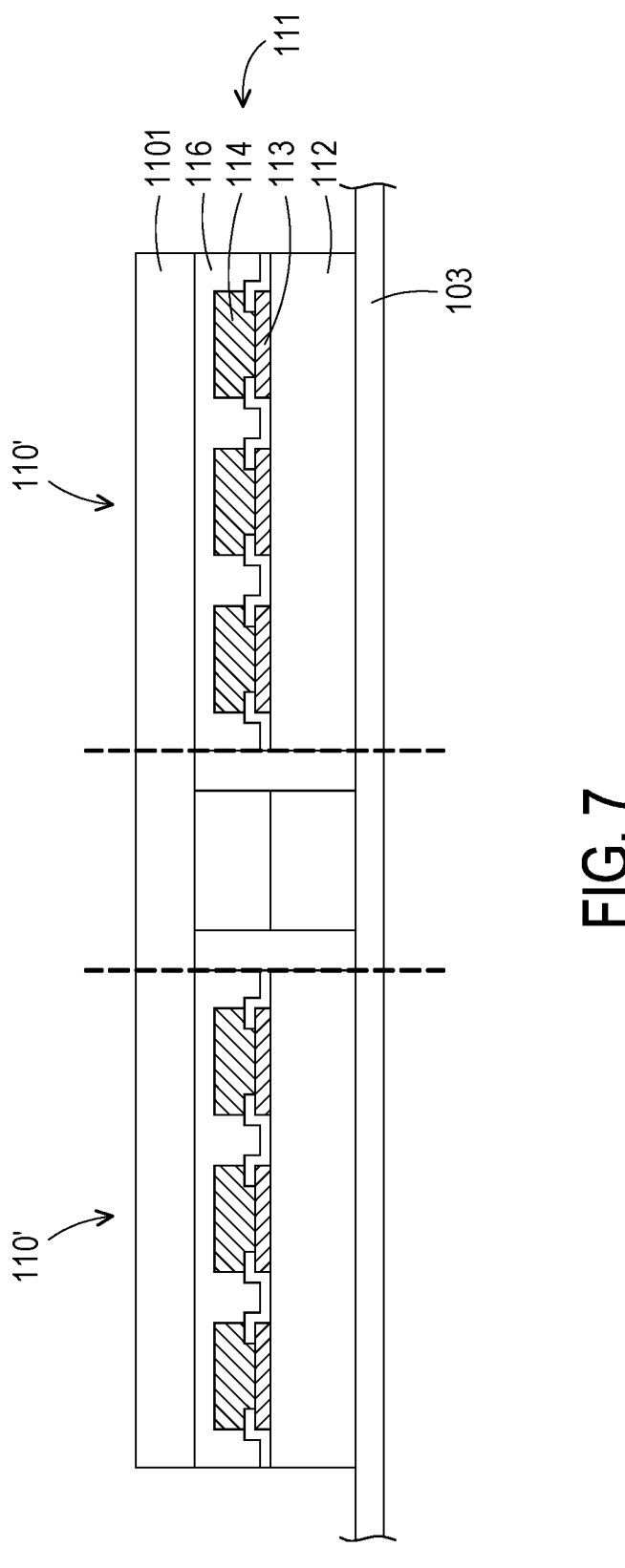

Referring to FIG. 7, then, the semiconductor wafer 111 may be singulated into a plurality of semiconductor devices 110 along the dicing lines. The singulation process may be performed by dicing the semiconductor wafer 111 with, for example, a die saw. In other embodiment, the singulation process may be performed by etching with a patterned mask to separate the semiconductor devices 110. In accordance with an embodiment of the present disclosure, the semiconductor devices 110 may be logic device dies including logic circuits therein. In some exemplary embodiments, the semiconductor devices 110 are dies that are designed for mobile applications, and may include a Power Management Integrated Circuit (PMIC) die and a Transceiver (TRX) die, for example.

Figure 8:
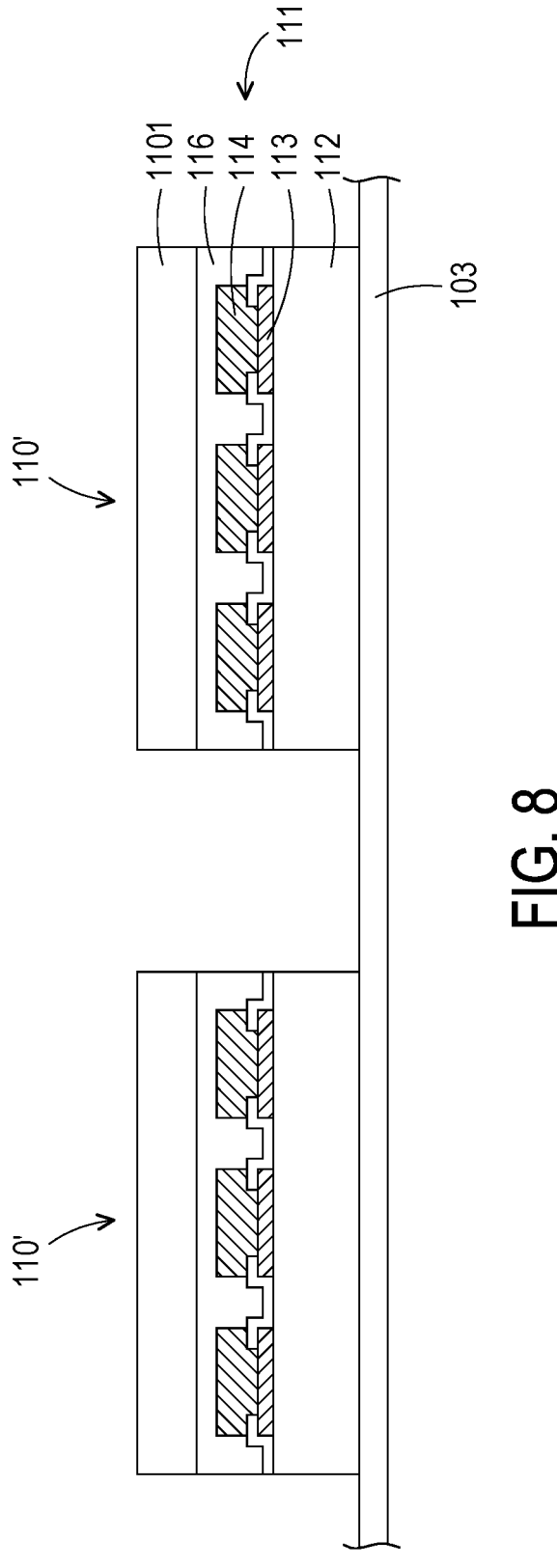
Figure 9:
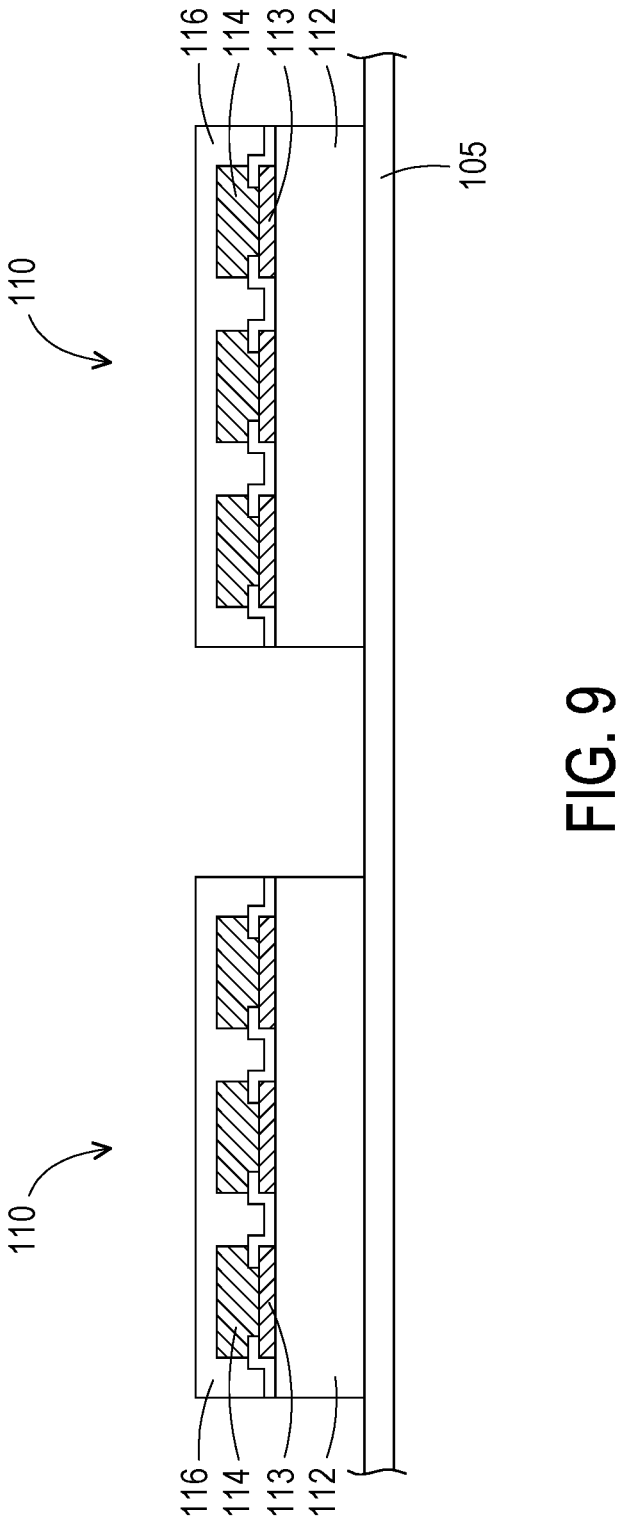
Figure 10:
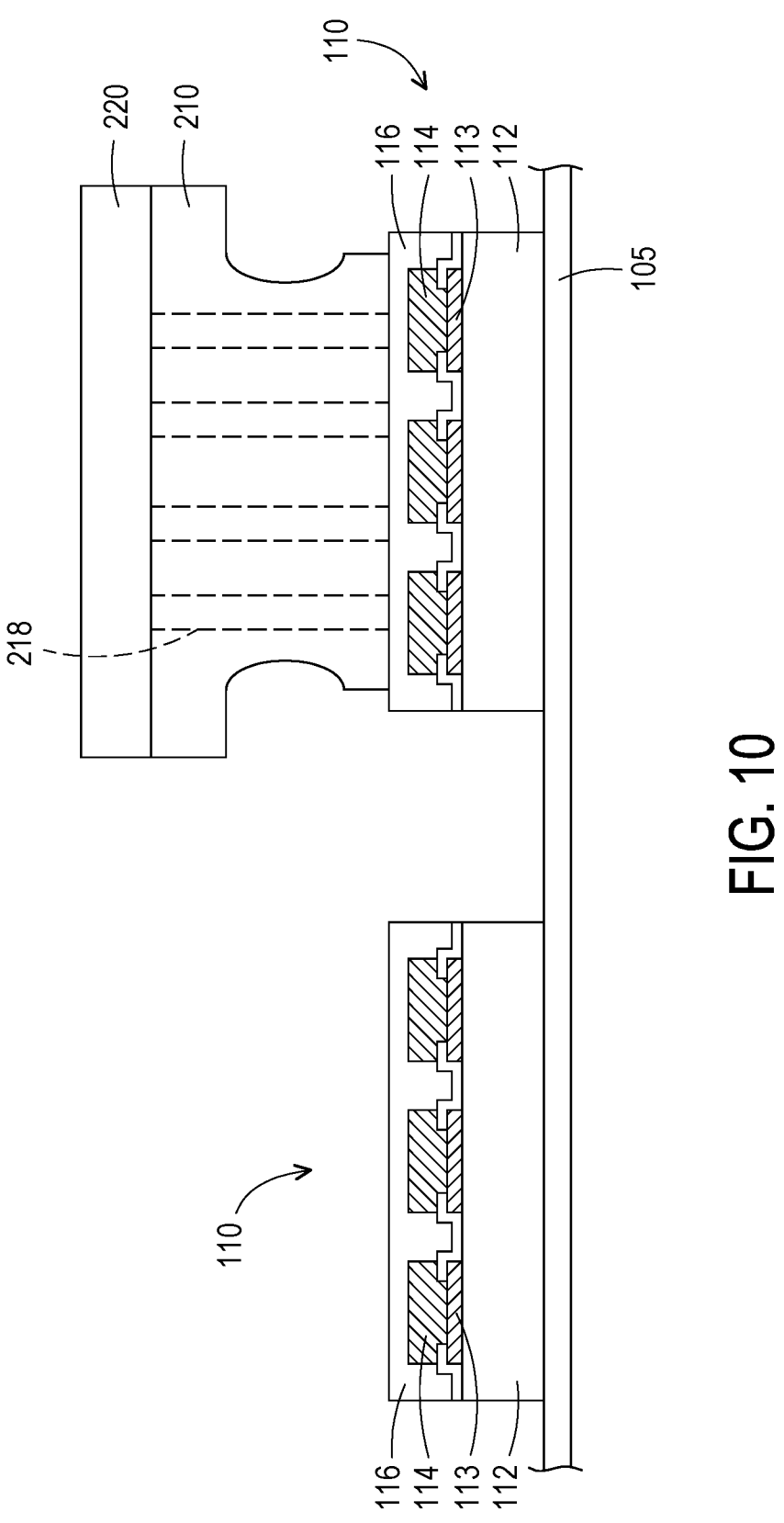

Referring to FIG. 7 to FIG. 9, after dicing, the semiconductor devices 110 are singulated to each other but stay on the dicing tape 101. In one embodiment, since the die-to-die spacing is small, e.g., several tens micrometers or less, the singulated semiconductor devices 110 may need to be transported to another carrier, e.g., from the dicing tape 101 to the tape carrier 105, to enlarge the die-to-die spacing when the semiconductor devices 110 are placed onto tape carrier 105, as shown in FIG. 8. Then, the protection layer 1101 is removed as shown in FIG. 9. In some embodiments, the transportation of the semiconductor devices 110 from the dicing tape 101 to the tape carrier 105 may be performed by the pick and place device 200.

Figure 20:
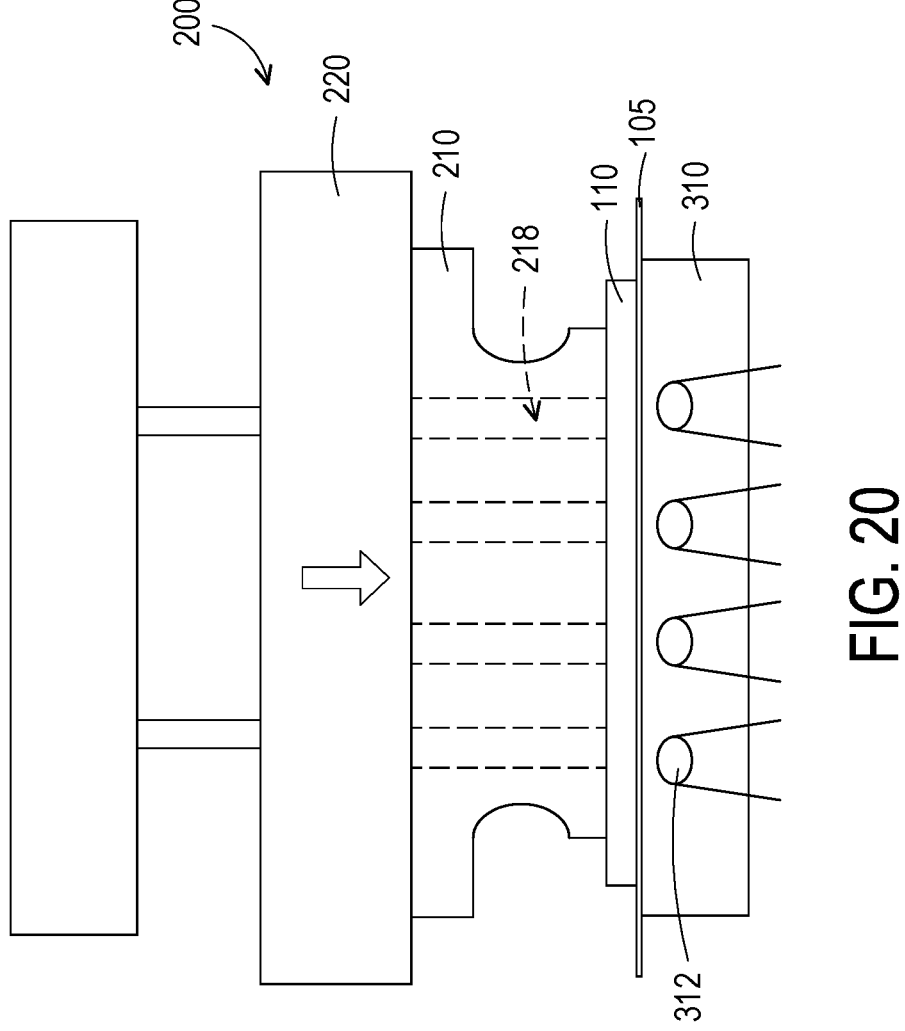
FIG. 20 to FIG. 22 illustrate cross sectional views of intermediate stages in the manufacturing of a semiconductor package according to some exemplary embodiments of the present disclosure.
Figure 21:
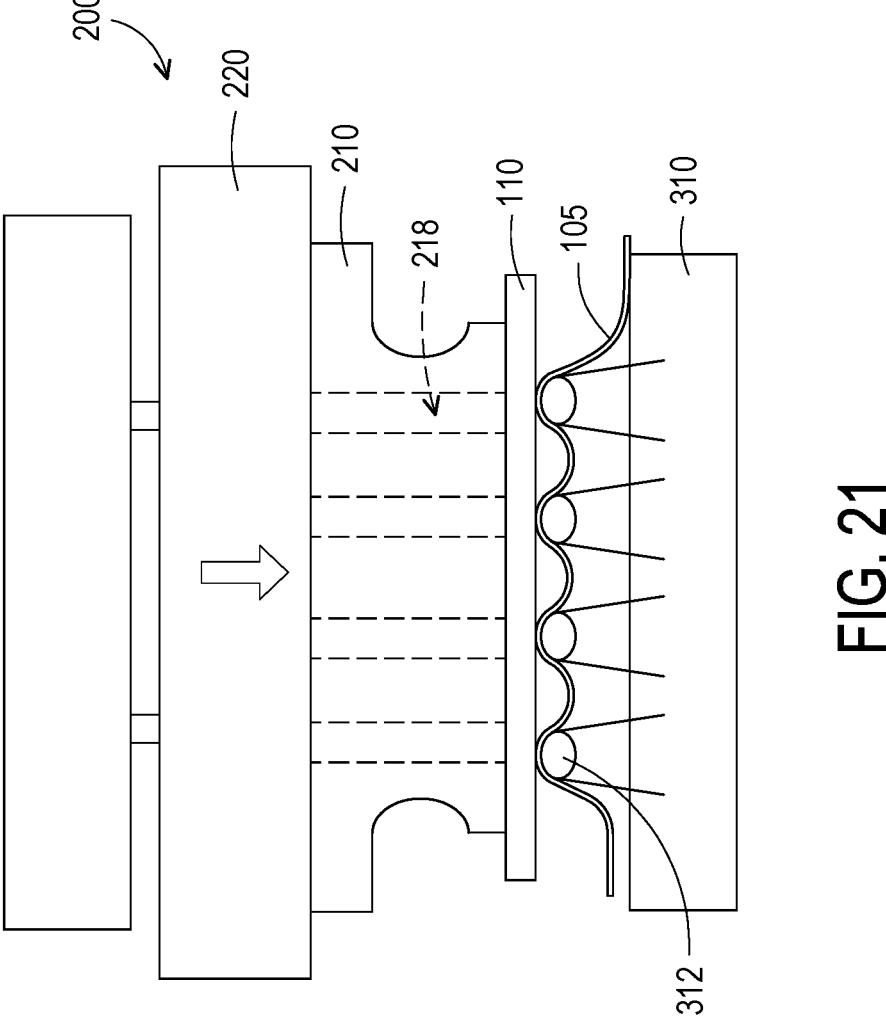
Figure 22:
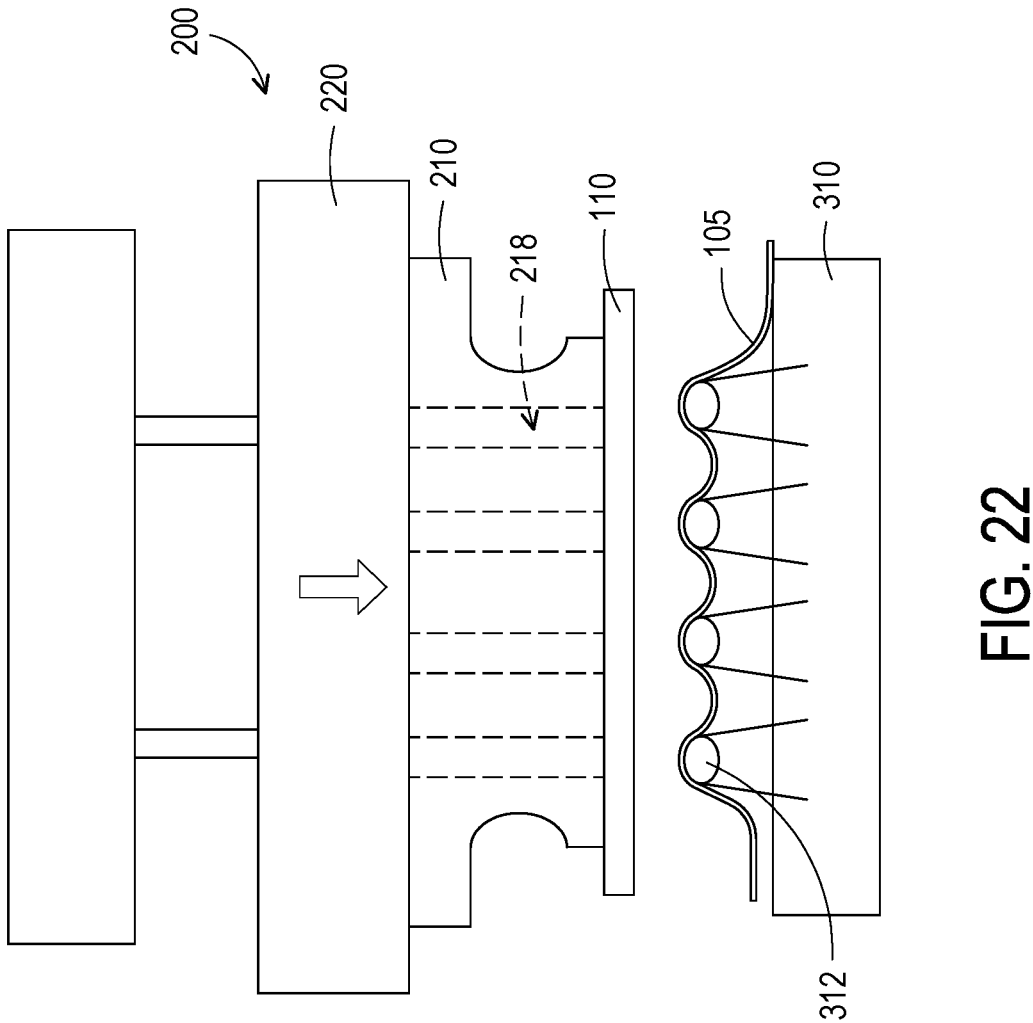

FIG. 20 to FIG. 22 illustrate cross sectional views of intermediate stages in the manufacturing of a semiconductor package according to some exemplary embodiments of the present disclosure. With now reference to FIG. 10 and FIG. 20 together, then, in some embodiments, the semiconductor devices 110 are picked up from the tape carrier 105 by the pick and place device 200. In some embodiments, the tape carrier 105 can include a UV-cured, cross-linked material that engages with the semiconductor device 110 via electrostatic forces, mechanical forces (by conforming to topographical features on the backside of the semiconductor device 110), and/or other forces. In a particular embodiment, the flexible head 210 of the pick and place device 200 is configured to pick up individual semiconductor devices 110 and pick them up from the tape carrier 105. In order to pick up semiconductor device 110 one at a time, the workpiece handling apparatus is configured to provide for relative movement between the chuck table 310 and the flexible head 210. Accordingly, the holder 220 along with the flexible head 210 can move, e.g., via a robotic device or other suitable device. Accordingly, the flexible head 210 can move along multiple axes, e.g., along three axes, as indicated by reference numbers X2, Y2 and Z2. The picked semiconductor device 110 can be placed at another location (e.g., a substrate 160 over the chuck table 320 shown in FIG. 1) within the overall workpiece handling apparatus, or can be transferred outside the workpiece handling apparatus. The flexible head 210 is firstly moved to be in contact with the semiconductor device 110 prior to picking up. The flexible head 210 can be coupled to the vacuum pump, which allows the flexible head 210 to releasably engage with the semiconductor device 110 via a suction or vacuum force. The vacuum pump is configured to provide a vacuum between the flexible head 210 and the semiconductor device 110 for picking up the semiconductor device 110.

With now reference to FIG. 21, prior to lifting the semiconductor device 110 away from the tape carrier 105, an ejector device 312 can push the semiconductor device 110 upwardly relative to its neighbors, to facilitate picking just one semiconductor device 110 up at a time. The ejector device 312 can include one or more ejector pins that are actuated to extend upwardly through corresponding apertures on the chuck table 310, via one or more actuators. When the ejector device 312 begins pushing up under the tape carrier 105 to start raising the semiconductor device 110, the tape carrier 105 become more tensioned/tented, and the semiconductor device 110 is pushed further up off the surface of the adhesive tape carrier 105. This process causes the tape carrier 105 to peel away from the backside of the semiconductor device 110 until the semiconductor device 110 becomes dislodged from the tape carrier 105. Although 4 ejector pins are illustrated in FIG. 20 to FIG. 22, it is to be understood that one or more ejector pins may be implemented depending on the size of the semiconductor device and aspect ratio, as is understood by those of ordinary skill in the art. When the ejector device 312 are extended upwardly, the semiconductor device 110 is raised relative to the neighboring semiconductor device 110. This arrangement can make it easier for the flexible head 210 to retrieve one semiconductor device 110 at a time. The vacuum pump remains activated so that the flexible head 210 holds the semiconductor device 110 as it dislodges from the tape carrier 105.

FIG. 22 schematically illustrates a point in the picking up process of the semiconductor device 110 where the flexible head 210 lifts the semiconductor device 110 from the tape carrier 105 through vacuum. Then, the ejector device 312 may be withdrawn back into the chuck table 310 and the tensioned tape carrier 105 springs back to its original position. At this point, the released semiconductor device 110 can be moved by the flexible head 210 to another location (e.g., a substrate 160 in FIG. 11) for mounting.

Figure 23:
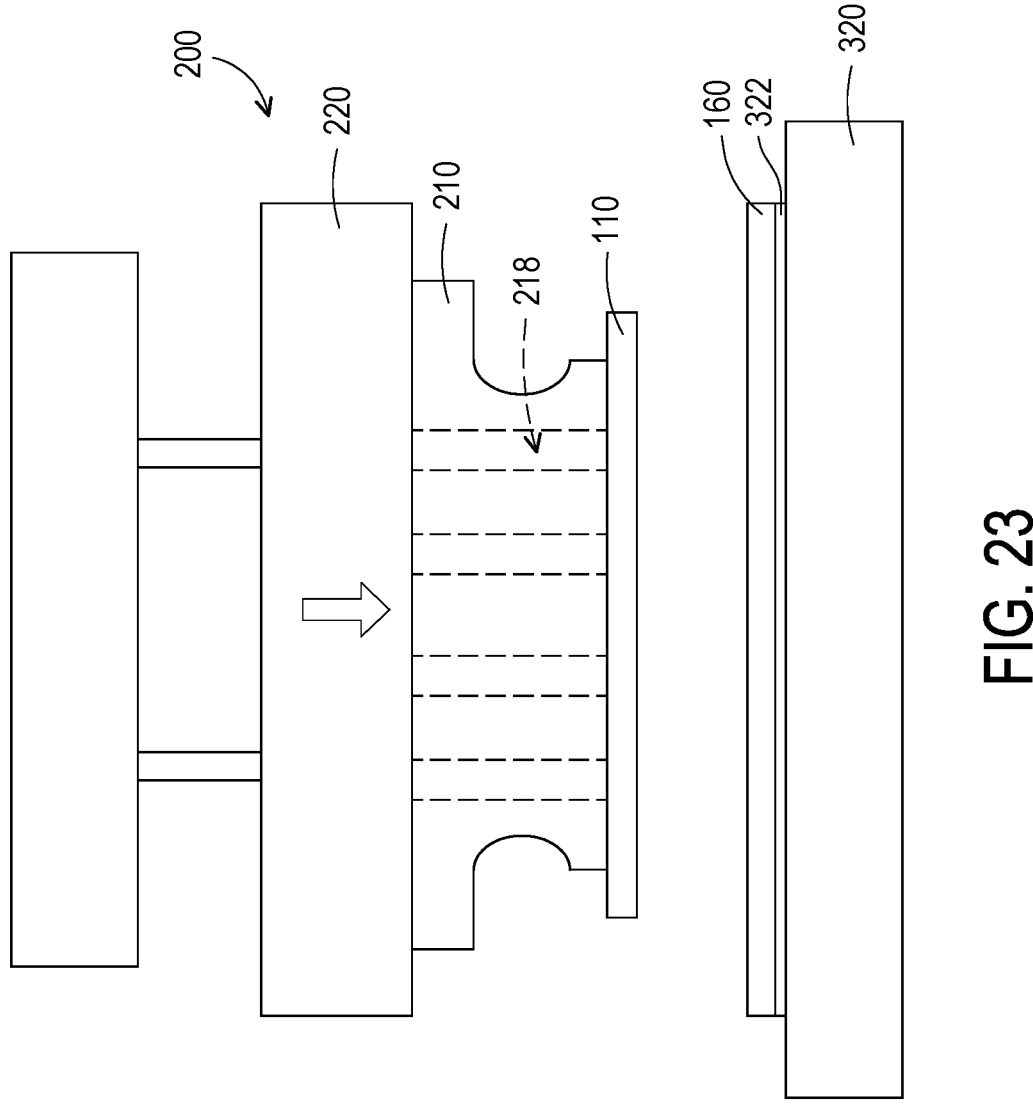
FIG. 23 to FIG. 25 illustrate cross sectional views of intermediate stages in the manufacturing of a semiconductor package according to some exemplary embodiments of the present disclosure.
Figure 24:
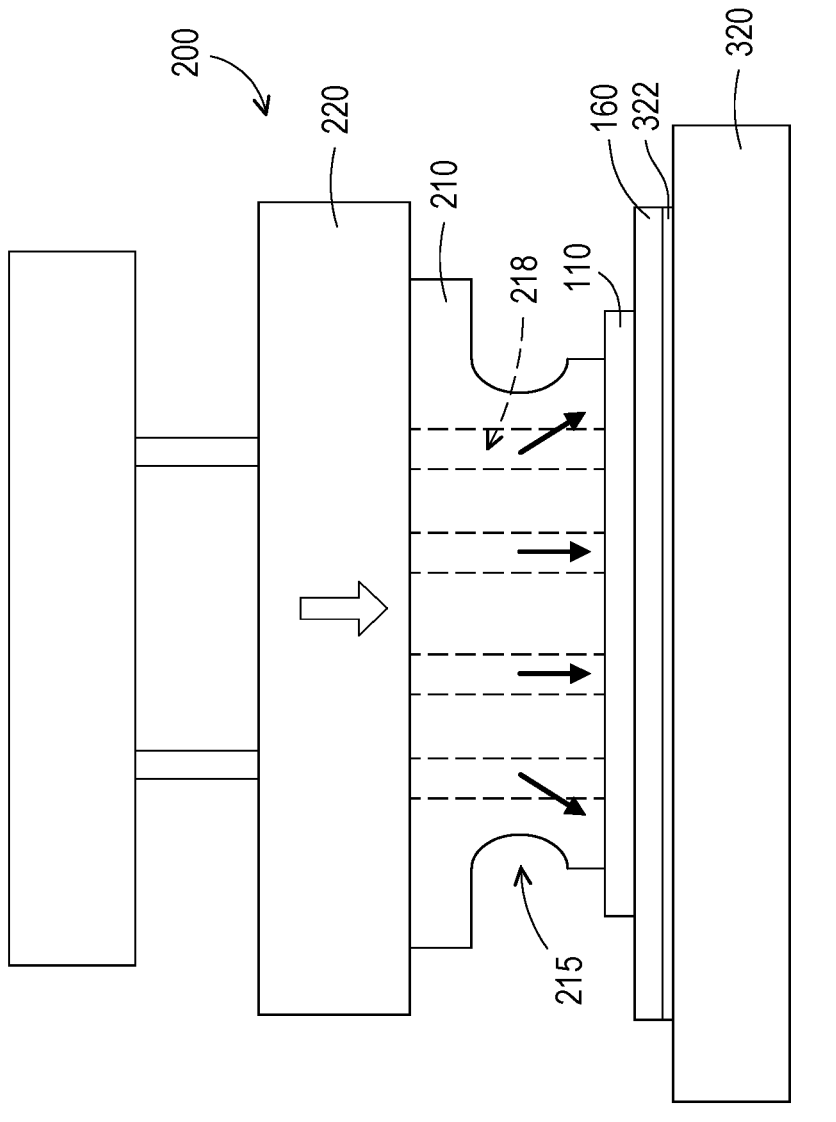
Figure 25:
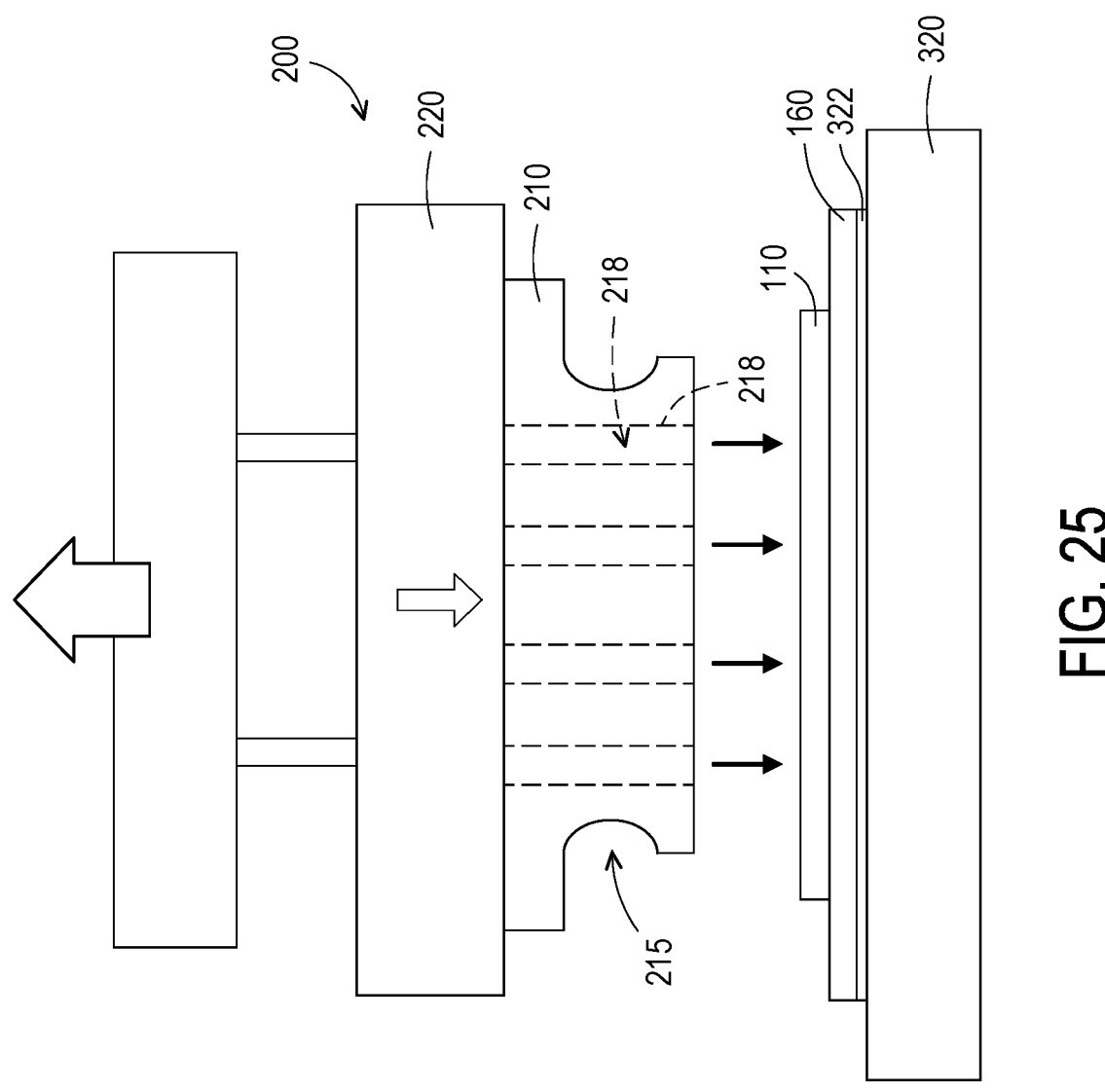

FIG. 23 to FIG. 25 illustrate cross sectional views of intermediate stages in the manufacturing of a semiconductor package according to some exemplary embodiments of the present disclosure. With now reference to FIG. 11, FIG. 23 and FIG. 24, the semiconductor device 110 is placed and pressed onto a substrate 160 by the flexible head 210 of the pick and place device 200. In some embodiments, an adhesive layer 165 may be disposed over the substrate 160. In some embodiments, the substrate 160 may be a glass carrier, a ceramic carrier, or the like. The adhesive layer 165 may be a light to heat conversion release coating (LTHC), or the like. In some embodiments, an insulation layer 170a may be optionally disposed on the substrate 160, or on the adhesive layer 165 (if any). Then, a plurality of through vias 130 are formed on the substrate 160, and the through vias 130 surrounds a device area. In the present embodiment, the through vias 130 are formed on the insulation layer 170a located on the substrate 160, but the disclosure is not limited thereto.

Figure 11:
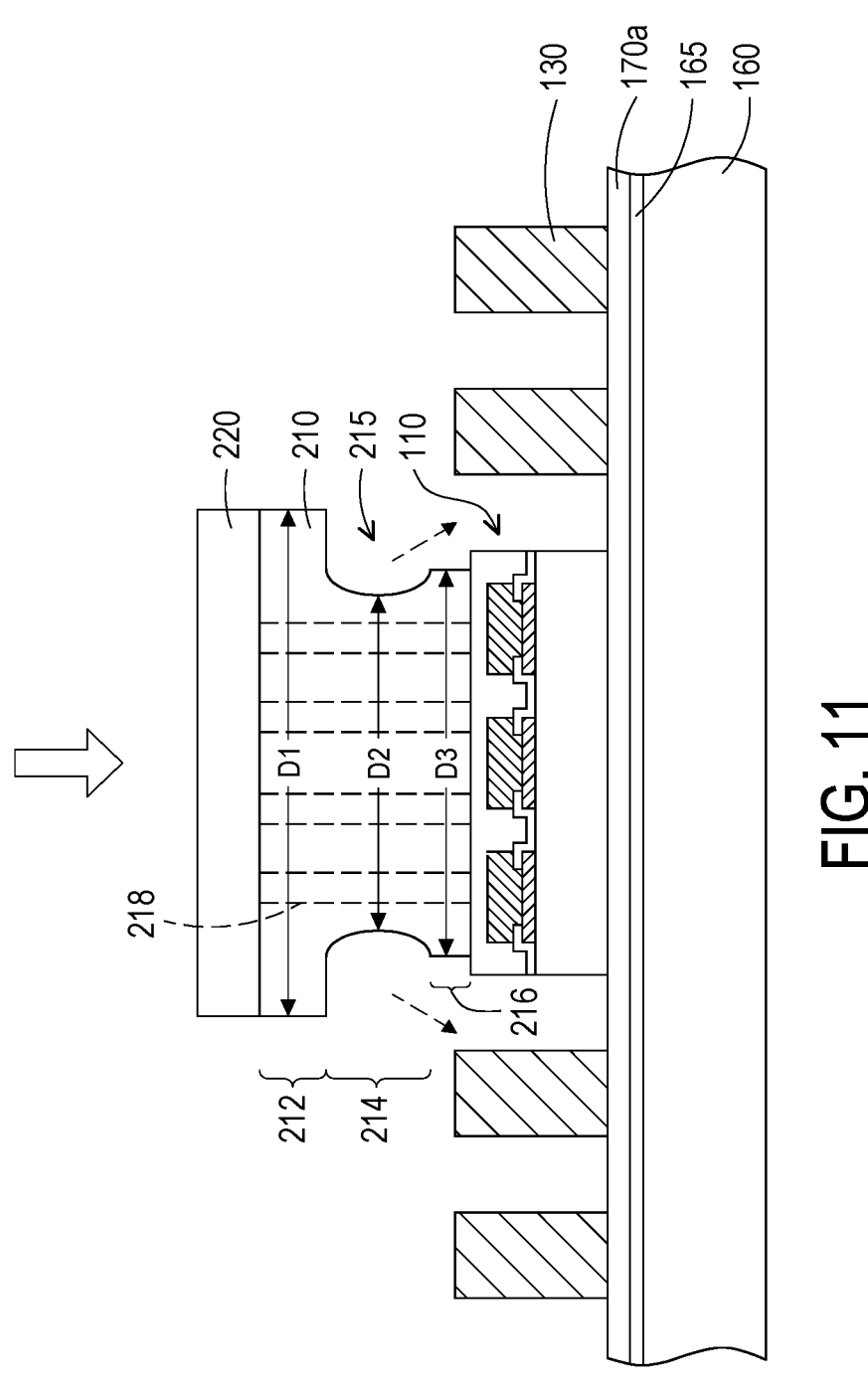

In some embodiments, the substrate 160 may be a removable carrier 160 that includes a plurality of die areas arranged in, for example, an array manner. In some embodiments, a plurality of through vias 130 may be formed to surround each of the die areas as it is illustrated in FIG. 11, and a plurality of semiconductor devices 110 may be disposed on the die areas respectively, so the through vias 130 may surround each of the semiconductor devices 110. With such arrangement, a plurality of semiconductor packages can be formed concurrently. For the sake of brevity and clarity, the manufacturing process of one of the semiconductor packages is illustrated.

In some embodiments, the through vias 130 may be pre-formed, and are then placed on the carrier 160. In alternative embodiments, the through vias 130 may be formed by, for example, plating process. The plating of the through vias 130 may be performed before the placement of the semiconductor device 110, and may include forming a seed layer (not shown) over carrier 160, forming and patterning a photo resist layer (not shown), and plating the through vias 130 on the portions of the seed layer that are exposed through the photo resist layer. The photo resist layer and the portions of the seed layer covered by the photo resist layer may then be removed. The semiconductor device 110a may then be placed over the carrier 160. The material of the through vias 130 may include copper, aluminum, or the like. Accordingly, the bottom ends of the through vias 130 are substantially level with the back surface of the semiconductor device 110.

Then, a bonding force may be applied through the flexible head 210 to bond the semiconductor device 110 and the substrate 160 together. With the configuration of minimum width D2 of the neck portion substantially smaller than a maximum width D3 of the bonding portion 216, the bonding force can be distributed more evenly, e.g., from the center region of the bonding portion 216 spreading out toward the peripheral region of the bonding portion 216. Accordingly, the bonding surface of the bonding portion 216 can be in fully contact with the semiconductor device 110 when being attached to the substrate 160, so as to reduce issues of stress concentration, which may lead to poor bonding quality, delamination, or even die crack. In some embodiments, the electrical contacts 114 of the semiconductor device 110 faces the flexible head 210 when the flexible head 210 is pressed against the semiconductor device 110 for bonding the semiconductor device 110 onto the substrate 160. Accordingly, the flexible head 210 is composed of flexible material to avoid damaging the electrical contacts 114 of the semiconductor device 110.

With now reference to FIG. 11 and FIG. 25, the vacuum pump is configured to provide an air flow (illustrated as arrows) toward the flexible head 210 after the flexible head 210 places the semiconductor device 110 to a destination, e.g., the substrate 160 over the chuck table. For example, the air flow is provided by the pick and place device 200 to push the semiconductor device 110 toward the substrate 160 when the flexible head 210 is still in contact with the semiconductor device 110. In the present embodiment, the vacuum pump may be configured to reverse the flow of air through the channels 218 and blow air outwards from the flexible head 210, which provides an additional force to push the semiconductor device 110 onto the substrate 160 over the chuck table (e.g., chuck table 320 in FIG. 1) while the vacuum pump of the chuck table provides the suction force for holding substrate 160 onto the chuck table. After the semiconductor device 110 is attached to the substrate 160, the pick and place device 200 may be moved away from the chuck table.

Figures 12, 13:
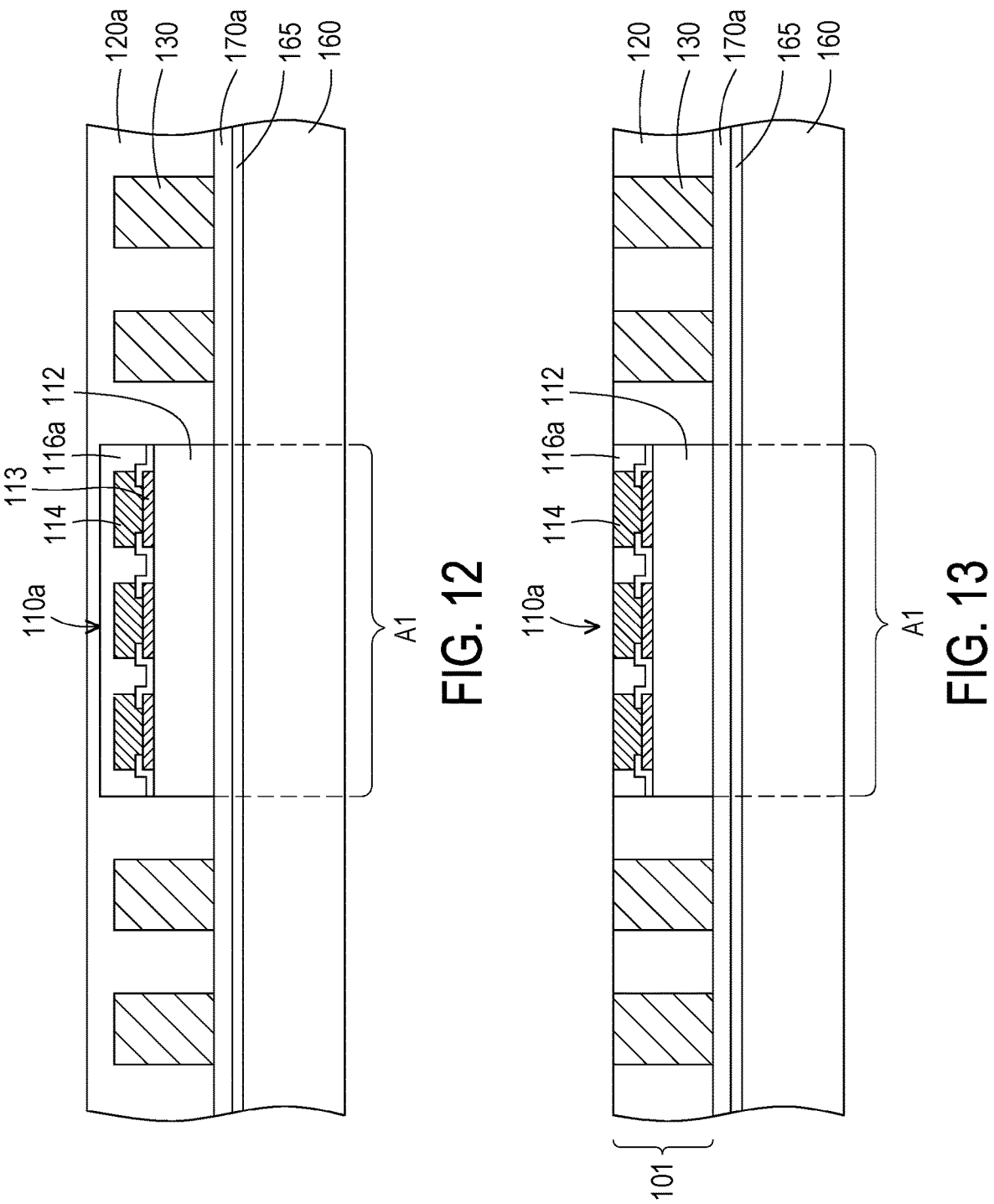

Then, referring to FIG. 12, the semiconductor device 110 and the through vias 130 on the substrate 160 are encapsulated by an encapsulating material 120a. In other words, the encapsulating material 120a is formed over the substrate 160 to at least laterally encapsulate the semiconductor device 110, and the through vias 130. In some embodiments, the encapsulating material 120a fills the gaps between the semiconductor device 110 and the through vias 130, and may be in contact with the insulation layer 170a. The encapsulating material 120a may include a molding compound, an epoxy, or a resin, etc. In some embodiments, a top surface of the encapsulating material 120a may be higher than the top ends of the through vias 130 and the top surface of the dielectric layer 116. Namely, the encapsulating material 120a covers the top ends of the through vias 130 and the top surface of the dielectric layer 116.

Then, a thinning process, which may be a grinding process, is performed to thin the encapsulating material 120a (and the dielectric layer 116) until the top ends of the through vias 130 and the top surfaces of the electrical contacts 114 are revealed. The resulting structure is shown in FIG. 13. Due to the thinning process, the top ends of the through vias 130 are substantially level with the top surfaces of the electrical contacts 114, and are substantially level with the top surface of the encapsulating material 120 and the top surface of the dielectric layer 116 as shown in FIG. 13. Throughout the description, the resultant structure including the semiconductor device 110, the through vias 130 and the encapsulating material 120 as shown in FIG. 13 is referred to as structure 101, which may have a wafer form in the process. Accordingly, in the structure 101, the through vias 130 extend through the structure 101 and surround semiconductor device 110, and the encapsulating material 120 encapsulates the semiconductor device 110 and the through vias 130. In other words, the encapsulating material 120 encapsulates the semiconductor device 110 therein, and the through vias 130 extends through the encapsulating material 120.

Figure 14:
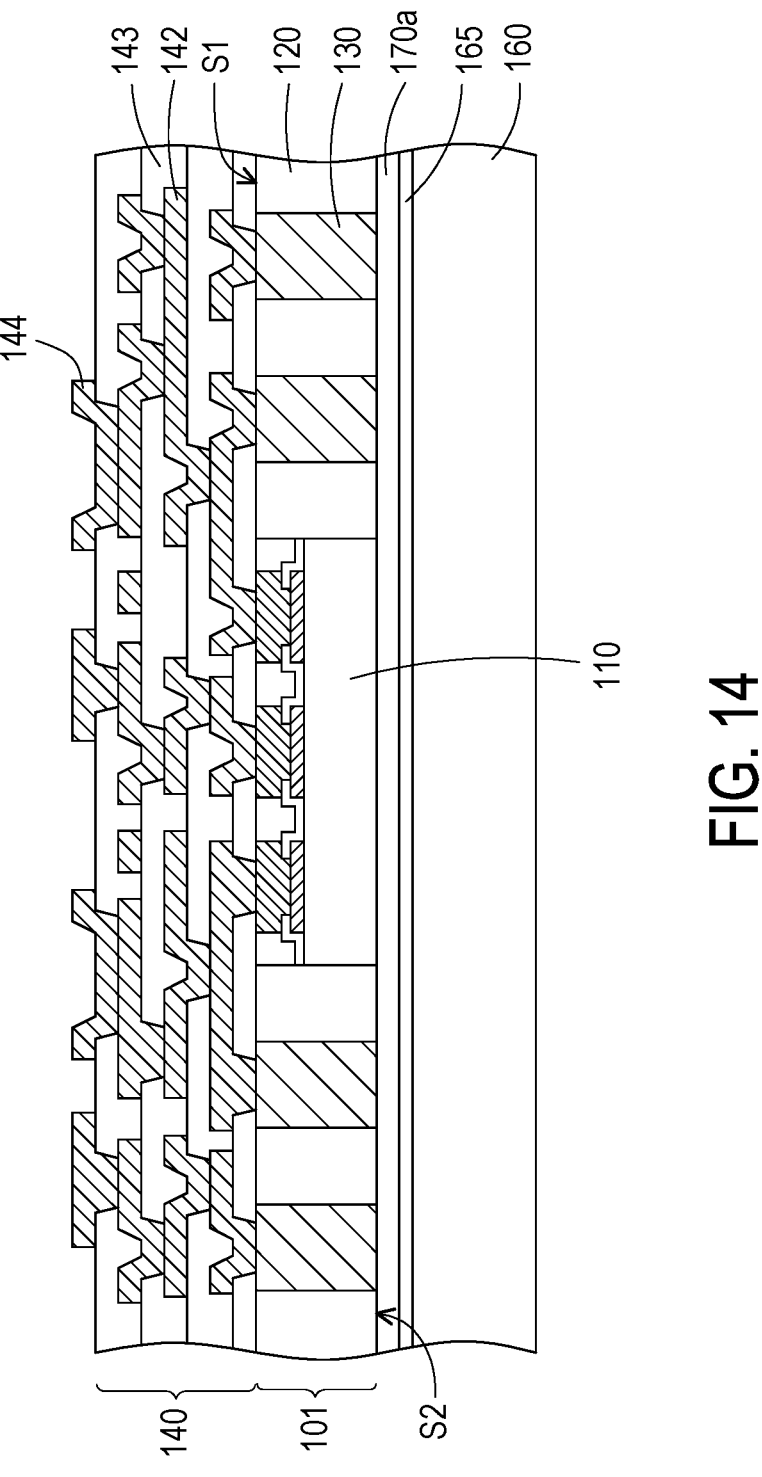

Next, referring to FIG. 14, a redistribution structure 140 is formed over the semiconductor device 110 and the encapsulating material 120. The redistribution structure 140 is electrically connected to the semiconductor device 110 and the through vias 130. In some embodiments, the redistribution structure 140 are formed over the structure 101 to connect to the electrical contacts 114 of the semiconductor device 110 and the through vias 130. In some embodiments, the redistribution structure 140 may also interconnect the electrical contacts 114 and the through vias 130. The redistribution structure 140 may be formed by, for example, depositing conductive layers, patterning the conductive layers to form redistribution circuits 142, partially covering the redistribution circuits 142 and filling the gaps between the redistribution circuits 142 with dielectric layers 143, etc. The material of the redistribution circuits 142 may include a metal or a metal alloy including aluminum, copper, tungsten, and/or alloys thereof. The dielectric layers 143 may be formed of dielectric materials such as oxides, nitrides, carbides, carbon nitrides, combinations thereof, and/or multi-layers thereof. The redistribution circuits 142 are formed in the dielectric layers 143 and electrically connected to the semiconductor device 110 and the through vias 130. In addition, an Under Bump Metallurgy (UBM) layer 144 may be formed on the redistribution structure 140 by sputtering, evaporation, or electroless plating, etc.

Figure 15:
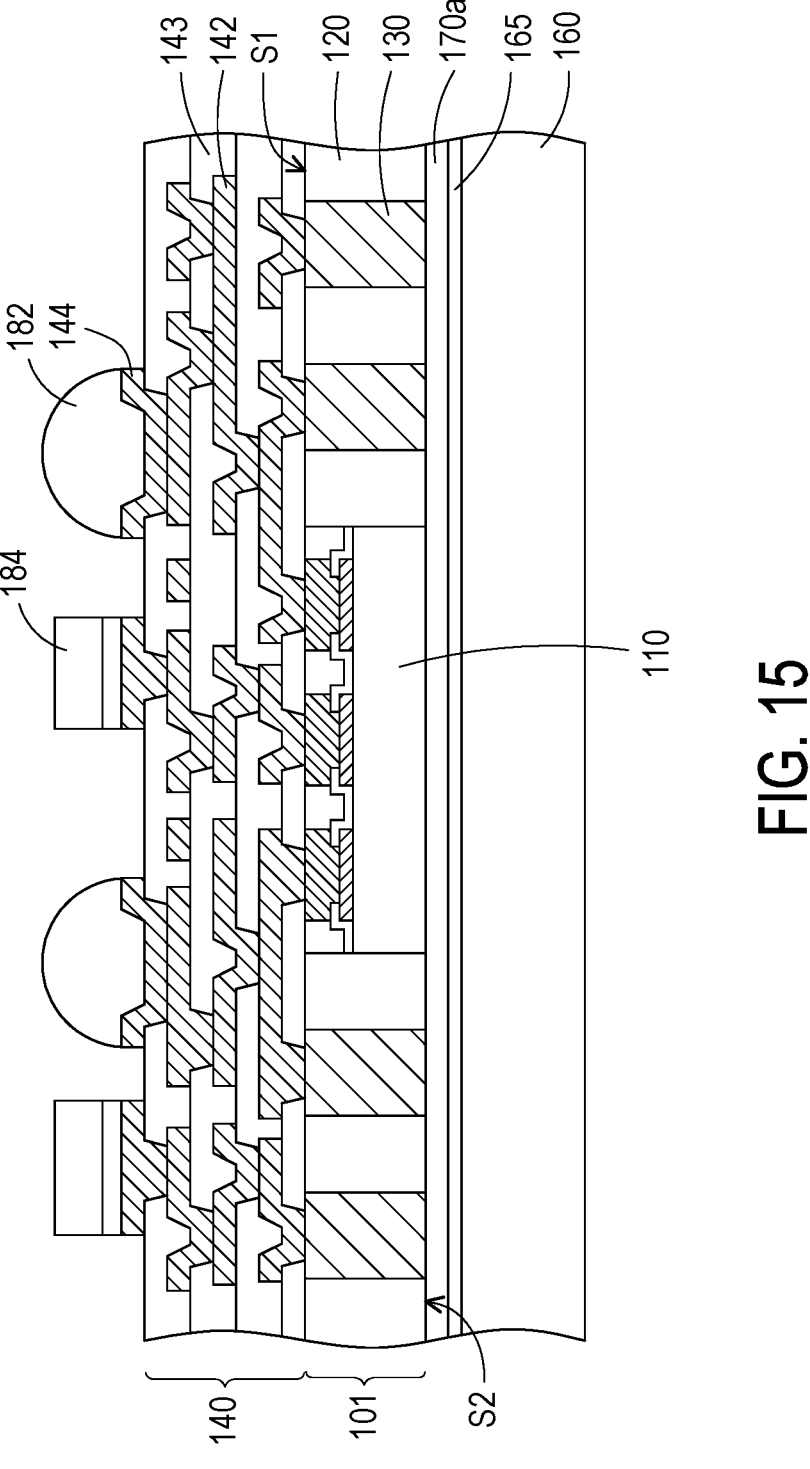

Referring to FIG. 15, at least one of electrical connector 182 and at least one Integrated Passive Device (IPD) 184 are disposed on the redistribution structure 140 in accordance with some exemplary embodiments. The formation of the electrical connectors 182 may include placing solder balls on the UBM layer 144 (or on the redistribution structure 140), and then reflowing the solder balls. In alternative embodiments, the formation of the electrical connectors 182 may include performing a plating process to form solder regions on the UBM layer 144 (or on the redistribution structure 140), and then reflowing the solder regions. The electrical connector 182 may also include conductive pillars, or conductive pillars with solder caps, which may also be formed through plating. The IPD 184 may be fabricated using standard wafer fabrication technologies such as thin film and photolithography processing, and may be mounted on the redistribution structure 140 through, for example, flip-chip bonding or wire bonding, etc.

Figure 16:
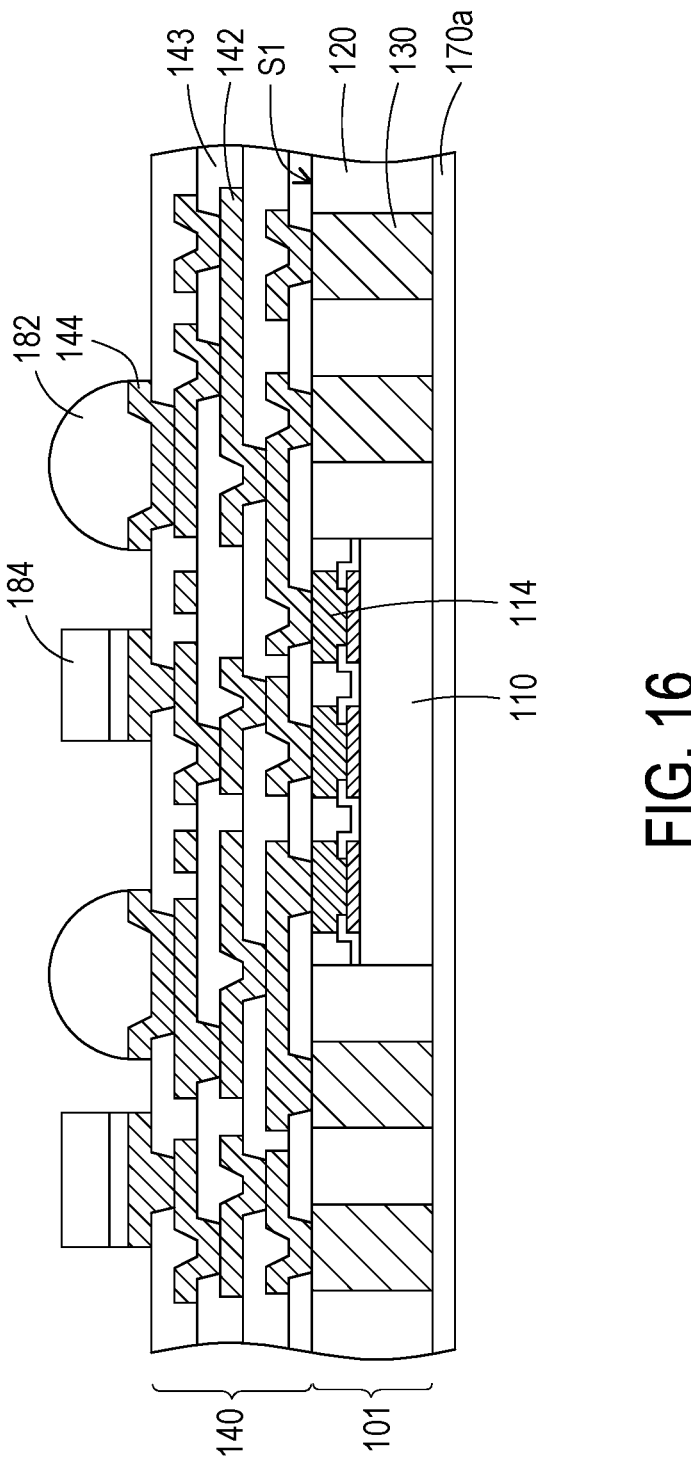

Then, referring to FIG. 16, the substrate 160 may be removed. In some embodiments, the substrate 160 is detached from the structure 101, and the insulation layer 170a (if any), by causing the adhesive layer 165 to lose or reduce adhesion. The adhesive layer 165 is then removed along with the substrate 160. For example, the adhesive layer 165 may be exposed to UV light, so that the adhesive layer 165 loses or reduces adhesion, and hence the substrate 160 and the adhesive layer 165 can be removed from the structure 101.

After the substrate 160 is removed, the bottom ends of the through vias 130 are revealed. In the illustrated structure, the bottom ends of the through vias 130 are level with the bottom surface of the semiconductor device 110 and the bottom surface of the encapsulating material 120. In the embodiments of the insulation layer 170a being omitted, a grinding process may be performed to lightly grind the back surface of semiconductor device 110 and the bottom ends of the through vias 130. Alternatively, the grinding process may be skipped.

Figure 17:
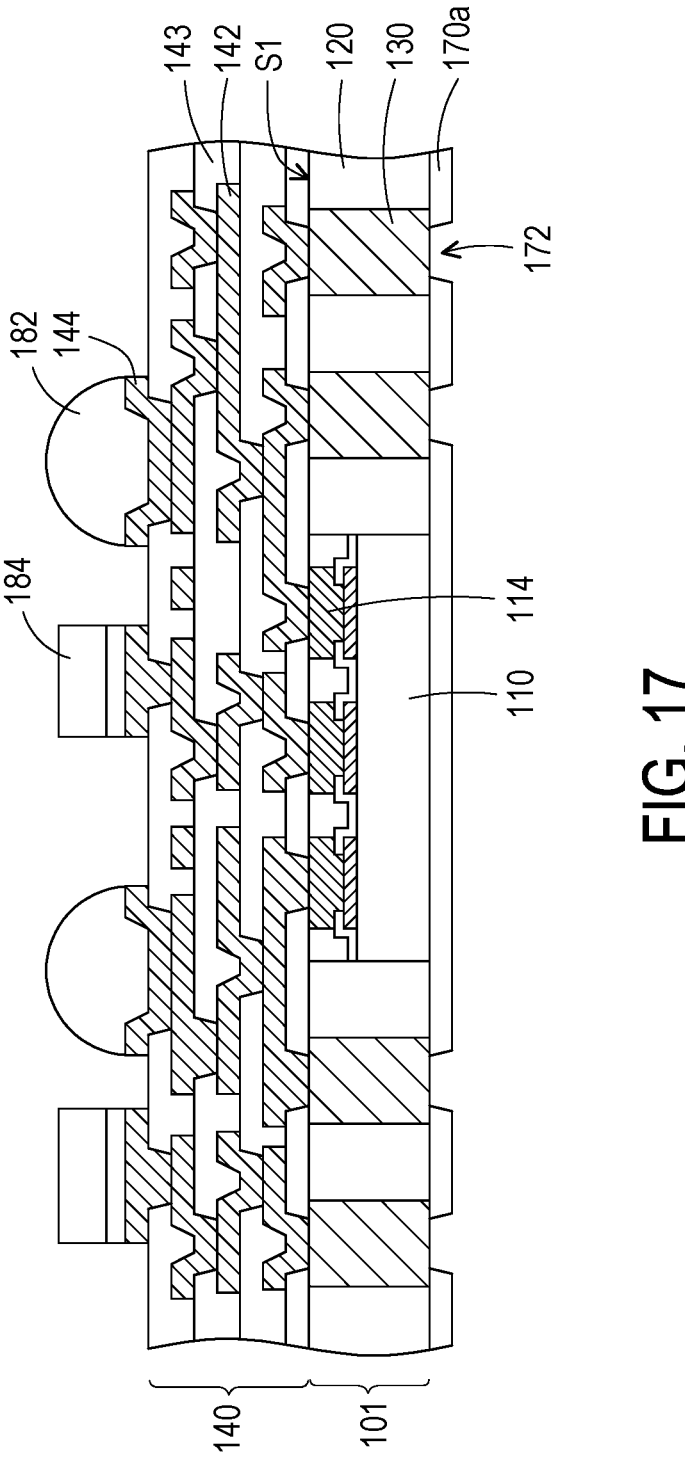

Referring to FIG. 17, in the embodiments having the insulation layer 170a, a patterning process may then be performed on the insulation layer 170a to form a plurality of openings 172. Accordingly, the insulation layer 170 having a plurality of openings 172 are formed. The openings 172 are located on the through vias 130 respectively to reveal the bottom ends of the through vias 130. In some embodiments, the openings 172 may be formed by photolithography process, laser drilling process, etc.

Figure 18:
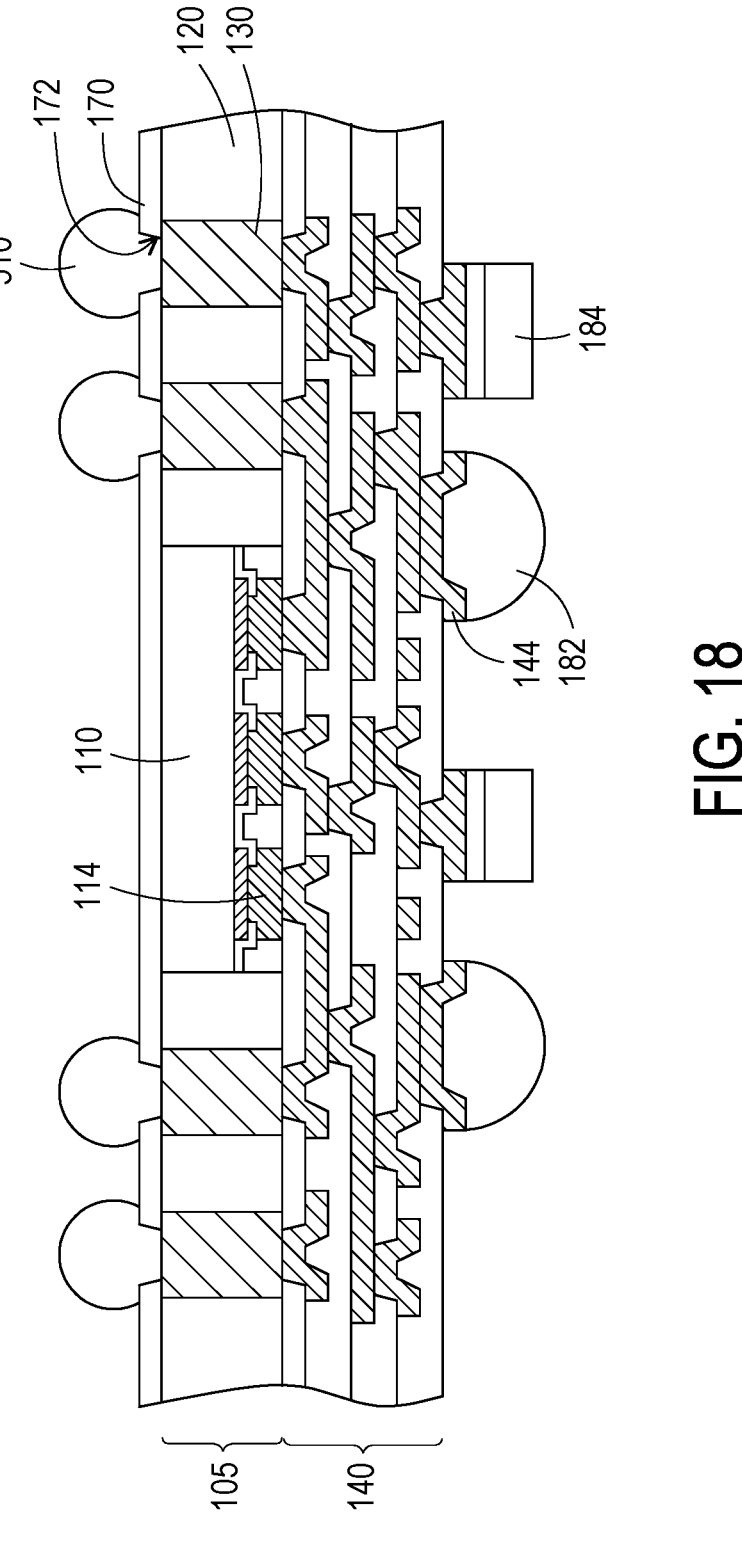

Referring to FIG. 18, a plurality of electrical terminals 510 may be formed on the structure 101 to be electrically connected to the through vias 130. In some embodiments, the electrical terminals 510 are disposed in the openings 172 of the insulation layer 170 to be connected to the through vias 130.

Figure 19:
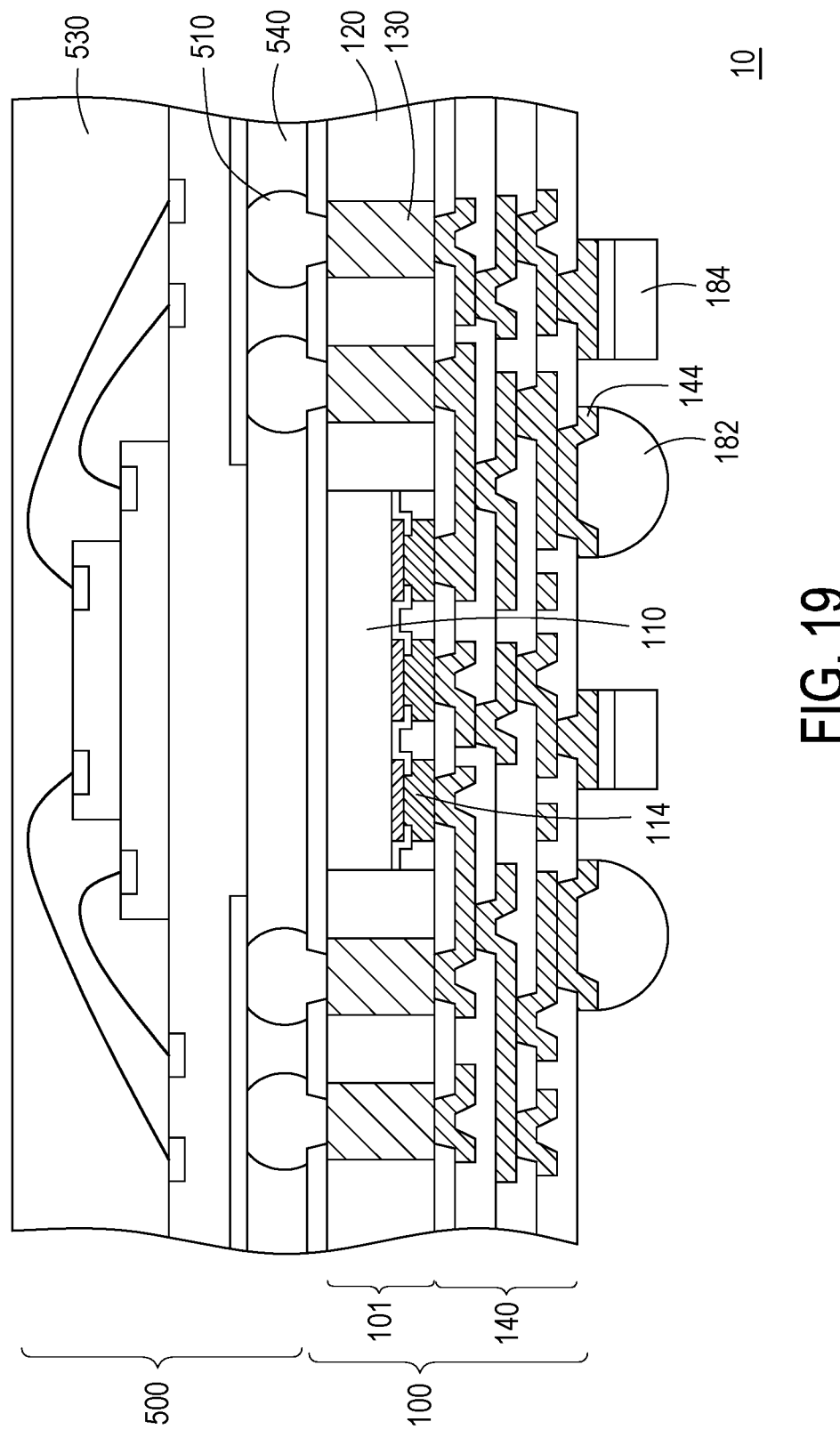

Then, referring to FIG. 19, in some embodiments, an upper package 500 may be placed and bonded over the lower package 100 by, for example, the pick and place device shown in the previous embodiments and the upper package 500 is electrically connected to the through vias 130 through the electrical terminals 510 of the upper package 500. Accordingly, the resulting structure is a package on package structure 10 as shown in FIG. 19. In some embodiments, the upper package 200 may be packages, device dies, passive devices, and/or the like. In some embodiments, the package on package structure 10 may combine vertically discrete memory and logic packages, and the upper package 500 may be employed in a memory such as Dynamic Random Access Memory and others, but the disclosure is not limited thereto.

In some embodiments, the bonding between the lower package 100 and the upper package 500 may be performed using flip chip bonding through the electrical terminals 510, which may comprise solder, for example. In some embodiments, an underfill 540 may be formed between the lower package 100 and the upper package 500 to encapsulate the electrical terminals 510. In some embodiments, the filler mentioned above may be the underfill 540 or other suitable filler.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a manufacturing method of a semiconductor package includes the following steps. A semiconductor device is picked up from a carrier by a pick and place device, wherein the pick and place device includes a flexible head having a bonding portion configured to be in contact with the semiconductor device, a neck portion connecting the bonding portion, wherein a minimum width of the neck portion is substantially smaller than a maximum width of the bonding portion. The semiconductor device is placed and pressed onto a substrate by the pick and place device. An encapsulating material is formed over the substrate to laterally encapsulating the semiconductor device. A redistribution structure is formed over the semiconductor device and the encapsulating material. The substrate is removed. In 2. The manufacturing method of the semiconductor package as claimed in claim 1, wherein when the semiconductor device is placed and pressed onto a substrate by the pick and place device, the flexible head faces a plurality of electrical contacts of the semiconductor device. In an embodiment, a difference between the maximum width of the bonding portion and the minimum width of the neck portion substantially ranges from 0.4 mm to 0.8 mm. In an embodiment, a thickness of the bonding portion substantially ranges from 0.1 mm to 0.4 mm. In an embodiment, the pick and place device further comprises a holder connecting the flexible head, and the flexible head further comprises a base portion connecting the holder, and the neck portion connecting between the base portion and the bonding portion, and the minimum width of the neck portion is substantially smaller than a maximum width of the base portion. In an embodiment, the manufacturing method of the semiconductor package further includes forming a plurality of through vias over the substrate, wherein the plurality of through vias surround a device area where the semiconductor device is disposed, wherein the encapsulating material laterally encapsulating the plurality of through vias. In an embodiment, when the semiconductor device is picked up from the carrier by the pick and place device, a vacuum environment is provided between the flexible head and the semiconductor device. In an embodiment, placing and pressing the semiconductor device onto the substrate by the pick and place device further comprising exerting a force on the semiconductor device through the flexible head. In an embodiment, when the semiconductor device is placed and pressed onto the substrate by the pick and place device, the flexible head faces a plurality of electrical contacts of the semiconductor device.

In accordance with some embodiments of the disclosure, a pick and place device includes a holder, and a flexible head. The holder is coupled to a vacuum pump. The flexible head includes a plurality of channels extending through the flexible head and in fluid communication with the vacuum pump, a base portion connecting the holder, a bonding portion configured to be in contact with a workpiece, a neck portion connecting between the base portion and the bonding portion, wherein a minimum width of the neck portion is substantially smaller than a maximum width of the bonding portion. In an embodiment, a difference between the maximum width of the bonding portion and the minimum width of the neck portion substantially ranges from 0.4 mm to 0.8 mm. In an embodiment, a thickness of the bonding portion substantially ranges from 0.1 mm to 0.4 mm. In an embodiment, the minimum width of the neck portion is substantially smaller than a maximum width of the base portion. In an embodiment, the neck portion has a curvy profile, and a width of the neck portion is gradually increases from a center of the neck portion to two opposite ends of the neck portion. In an embodiment, the neck portion comprises a groove surrounding a perimeter of the neck portion. In an embodiment, an angle included between adjacent sidewalls of the groove ranges from 85° to 95°.

In accordance with some embodiments of the disclosure, a workpiece handling apparatus includes a chuck table, and a pick and place device. The chuck table has a carrying surface. The pick and place device is disposed over the chuck table and configured to move relatively to the chuck table, wherein the pick and place device comprises a flexible head having a bonding portion configured to be in contact with the workpiece, a neck portion further away from the workpiece, wherein a minimum width of the neck portion is substantially smaller than a maximum width of the bonding portion. In an embodiment, the pick and place device further includes a vacuum pump in fluid communication with the flexible head, and the vacuum pump is configured to provide a vacuum between the flexible head and the workpiece for picking up the workpiece. In an embodiment, the vacuum pump is configured to provide an air flow toward the flexible head after the flexible head places the workpiece to a destination. In an embodiment, a material of the flexible head includes rubber, or silicone.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pick and place device, comprising:
a holder coupled to a vacuum pump; and
a flexible head comprising a plurality of channels extending through the flexible head and in fluid communication with the vacuum pump, a base portion connecting the holder, a bonding portion configured to be in contact with a workpiece, a neck portion connecting between the base portion and the bonding portion, wherein a minimum width of the neck portion is substantially smaller than a maximum width of the bonding portion, the neck portion has a curvy profile, and a width of the neck portion is gradually increases from a center of the neck portion to two opposite ends of the neck portion.

2. The pick and place device as claimed in claim 1, wherein a difference between the maximum width of the bonding portion and the minimum width of the neck portion substantially ranges from 0.4 mm to 0.8 mm.

3. The pick and place device as claimed in claim 1, wherein a thickness of the bonding portion substantially ranges from 0.1 mm to 0.4 mm.

4. The pick and place device as claimed in claim 1, wherein the minimum width of the neck portion is substantially smaller than a maximum width of the base portion.

5. The pick and place device as claimed in claim 1, wherein a maximum width of the base portion is substantially greater than the maximum width of the bonding portion.

6. A workpiece handling apparatus, comprising:
a chuck table for carrying a workpiece; and
a pick and place device disposed over the chuck table and configured to move relatively to the chuck table, wherein the pick and place device comprises a flexible head having a bonding portion configured to be in contact with the workpiece, a neck portion further away from the workpiece, wherein a width of the neck portion is gradually increases from a center of the neck portion toward an outer region of the neck portion.

7. The workpiece handling apparatus as claimed in claim 6, wherein the pick and place device further comprises a vacuum pump in fluid communication with the flexible head, and the vacuum pump is configured to provide a vacuum between the flexible head and the workpiece for picking up the workpiece.

8. The workpiece handling apparatus as claimed in claim 7, wherein the vacuum pump is configured to provide an air flow toward the flexible head after the flexible head places the workpiece to a destination.

9. The workpiece handling apparatus as claimed in claim 6, wherein a material of the flexible head comprises rubber, or silicone.

10. The workpiece handling apparatus as claimed in claim 6, wherein the neck portion has a curvy profile, and the width of the neck portion gradually increases from the center of the neck portion to two opposite ends of the neck portion.

11. The workpiece handling apparatus as claimed in claim 6, wherein the neck portion comprises a groove surrounding a perimeter of the neck portion.

12. The workpiece handling apparatus as claimed in claim 11, wherein an angle included between adjacent sidewalls of the groove ranges from 85 to 95°.

13. The workpiece handling apparatus as claimed in claim 6, wherein the chuck table further comprises a plurality of ejector pins disposed within the chuck table and configured to be lifted upwardly and protruded from a carrying surface of the chuck table.

14. A pick and place device, comprising:
a holder coupled to a vacuum pump; and a flexible head in fluid communication with the vacuum pump and comprises a base portion coupled to the holder, a bonding portion configured to be coupled to a workpiece, and a neck portion connecting between the base portion and the bonding portion, wherein a minimum width of the neck portion is substantially smaller than a maximum width of the bonding portion, and the neck portion comprises a groove surrounding a perimeter of the neck portion.

15. The pick and place device as claimed in claim 14, wherein an angle included between adjacent sidewalls of the groove ranges from 85 to 95°.

16. The pick and place device as claimed in claim 14, wherein the groove extends from a center of the neck portion toward two opposite ends of the neck portion, and comprises a curvy sidewall.

17. The pick and place device as claimed in claim 14, wherein a difference between the maximum width of the bonding portion and the minimum width of the neck portion substantially ranges from 0.4 mm to 0.8 mm.

18. The pick and place device as claimed in claim 14, wherein a thickness of the bonding portion substantially ranges from 0.1 mm to 0.4 mm.

19. The pick and place device as claimed in claim 14, wherein a maximum width of the base portion is substantially greater than the maximum width of the bonding portion.

20. The pick and place device as claimed in claim 14, wherein a material of the flexible head comprises rubber, or silicone.

* * * * *